(12) United States Patent
Shen

(10) Patent No.: US 9,666,508 B2
(45) Date of Patent: May 30, 2017

(54) GALLIUM ARSENIDE DEVICES WITH COPPER BACKSIDE FOR DIRECT DIE SOLDER ATTACH

(71) Applicant: SKYWORKS SOLUTIONS, INC., Woburn, MA (US)

(72) Inventor: Hong Shen, Palo Alto, CA (US)

(73) Assignees: Skyworks Solutions, Inc.; Woburn, Inc.

( * ) Notice: Subject to any disclaimer, the term of this patent is extended or adjusted under 35 U.S.C. 154(b) by 0 days.

(21) Appl. No.: 15/352,240

(22) Filed: Nov. 15, 2016

(65) Prior Publication Data

US 2017/0117248 A1    Apr. 27, 2017

Related U.S. Application Data

(63) Continuation of application No. 14/643,884, filed on Mar. 10, 2015, now Pat. No. 9,530,719.

(60) Provisional application No. 62/011,966, filed on Jun. 13, 2014.

(51) Int. Cl.
*H01L 23/48* (2006.01)
*H01L 23/00* (2006.01)

(52) U.S. Cl.
CPC ............ *H01L 23/481* (2013.01); *H01L 24/97* (2013.01)

(58) Field of Classification Search
CPC . H01L 23/481; H01L 23/4924; H01L 23/482; H01L 24/03; H01L 24/05; H01L 24/32
USPC .................................................. 257/751, 782
See application file for complete search history.

(56) References Cited

U.S. PATENT DOCUMENTS

| | | | |
|---|---|---|---|
| 3,896,479 A | 7/1975 | DiLorenzo et al. |
| 5,075,744 A | 12/1991 | Tsui |
| 6,140,703 A | 10/2000 | Cronin et al. |
| 6,297,147 B1 | 10/2001 | Yang et al. |
| 6,407,634 B1 | 6/2002 | Staudinger |
| 6,431,432 B1 | 8/2002 | McCormick et al. |
| 6,492,269 B1 | 12/2002 | Liu et al. |
| 6,495,019 B1 | 12/2002 | Filas et al. |
| 6,596,635 B1 | 7/2003 | Tiku et al. |
| 6,870,243 B2 | 3/2005 | Elliott et al. |
| 6,914,487 B1 | 7/2005 | Doyle |
| 6,982,441 B2 | 1/2006 | Yamaki et al. |
| 7,179,738 B2 | 2/2007 | Abbott |

(Continued)

OTHER PUBLICATIONS

Nishizawa, et al; Stress Suppression of Backside Metal in GaAs Devices; CS ManTech Conference Proceedings; p. 271; May 17-20, 2010; Portland, Oregon, USA.

(Continued)

*Primary Examiner* — Brook Kebede
(74) *Attorney, Agent, or Firm* — Knobbe Martens Olson and Bear LLP

(57) ABSTRACT

Systems, apparatuses, and methods related to the design, fabrication, and manufacture of gallium arsenide (GaAs) integrated circuits are disclosed. Copper can be used as the contact material for a GaAs integrated circuit. Metallization of the wafer and through-wafer vias can be achieved through copper plating processes disclosed herein. Direct die solder (DDS) attach can be achieved by use of electroless nickel plating of the copper contact layer followed by a palladium flash. GaAs integrated circuits can be singulated, packaged, and incorporated into various electronic devices.

20 Claims, 32 Drawing Sheets

(56) References Cited

U.S. PATENT DOCUMENTS

| | | |
|---|---|---|
| 7,402,515 B2 | 7/2008 | Arana et al. |
| 7,429,529 B2 | 9/2008 | Farnworth |
| 7,494,925 B2 | 2/2009 | Hiatt |
| 7,517,798 B2 | 4/2009 | Tuttle |
| 7,880,307 B2 | 2/2011 | Farnworth et al. |
| 7,898,064 B2 | 3/2011 | Tuttle |
| 7,923,842 B2 | 4/2011 | Shen et al. |
| 8,089,159 B1 | 1/2012 | Park |
| 8,094,764 B2 | 1/2012 | Lackey |
| 8,169,004 B2 | 5/2012 | Kohiro et al. |
| 8,318,519 B2 | 11/2012 | Doan et al. |
| 8,587,377 B2 | 11/2013 | Khesbak |
| 8,803,605 B2 | 8/2014 | Fowers |
| 9,066,368 B2 | 6/2015 | Lorenz |
| 2002/0048889 A1 | 4/2002 | Hayama et al. |
| 2002/0093101 A1 | 7/2002 | Iyer et al. |
| 2002/0101912 A1 | 8/2002 | Phelts |
| 2002/0106833 A1* | 8/2002 | Kobayashi ............ H01L 21/563 438/108 |
| 2003/0015721 A1 | 1/2003 | Slater et al. |
| 2003/0020174 A1 | 1/2003 | Kohno |
| 2003/0141593 A1 | 7/2003 | Zuniga-Ortiz et al. |
| 2004/0176053 A1 | 9/2004 | Yamashita |
| 2005/0085084 A1 | 4/2005 | Chang et al. |
| 2005/0110562 A1 | 5/2005 | Robinson |
| 2005/0127480 A1 | 6/2005 | Elliot et al. |
| 2005/0157476 A1 | 7/2005 | Goudarzi |
| 2006/0119425 A1 | 6/2006 | Phillips |
| 2007/0066054 A1 | 3/2007 | Uzoh et al. |
| 2007/0210340 A1 | 9/2007 | Zampardi |
| 2007/0215897 A1* | 9/2007 | Shen ..................... H01L 23/481 257/103 |
| 2009/0004981 A1 | 1/2009 | Eliezer |
| 2009/0097591 A1 | 4/2009 | Kim |
| 2009/0152676 A1 | 6/2009 | Wang |
| 2010/0078776 A1 | 4/2010 | Barth |
| 2011/0058601 A1 | 3/2011 | Kim |
| 2011/0095436 A1 | 4/2011 | Chen et al. |
| 2011/0117739 A1 | 5/2011 | Tuttle |
| 2011/0217841 A1 | 9/2011 | Chen et al. |
| 2012/0205916 A1 | 8/2012 | Vuong |
| 2012/0258594 A1 | 10/2012 | Barth et al. |
| 2012/0269240 A1 | 10/2012 | Balteanu |
| 2012/0295437 A1 | 11/2012 | Lu et al. |
| 2012/0326783 A1 | 12/2012 | Mathe |
| 2013/0034139 A1 | 2/2013 | Khlat |
| 2013/0109441 A1 | 5/2013 | Lorenz |
| 2013/0109442 A1 | 5/2013 | Dakshinamurthy |
| 2013/0127548 A1 | 5/2013 | Popplewell et al. |
| 2013/0207731 A1 | 8/2013 | Balteanu |
| 2013/0231069 A1 | 9/2013 | Drogi |
| 2013/0249095 A1 | 9/2013 | Shen |
| 2014/0240052 A1 | 8/2014 | Mao |
| 2014/0306763 A1 | 10/2014 | Hong |
| 2014/0361830 A1 | 12/2014 | Mathe |
| 2014/0361837 A1 | 12/2014 | Strange |
| 2015/0270806 A1 | 9/2015 | Wagh |
| 2016/0006396 A1 | 1/2016 | Wimpenny |

OTHER PUBLICATIONS

Johal et al; "Electroless Nickel/ Electroless Palladium/ Immersion Gold Process for Multi-Purpose Assembly Technology"; Atotech USA Inc.; Sep. 26, 2004; SMTA International.

Watanabe, et al; "Direct Electroless Nickel Plating on Copper Circuits Using DMAB as a Second Reducing Agent" IEMT/IMC Proceedings; pp. 149-153 (1998), no month.

* cited by examiner

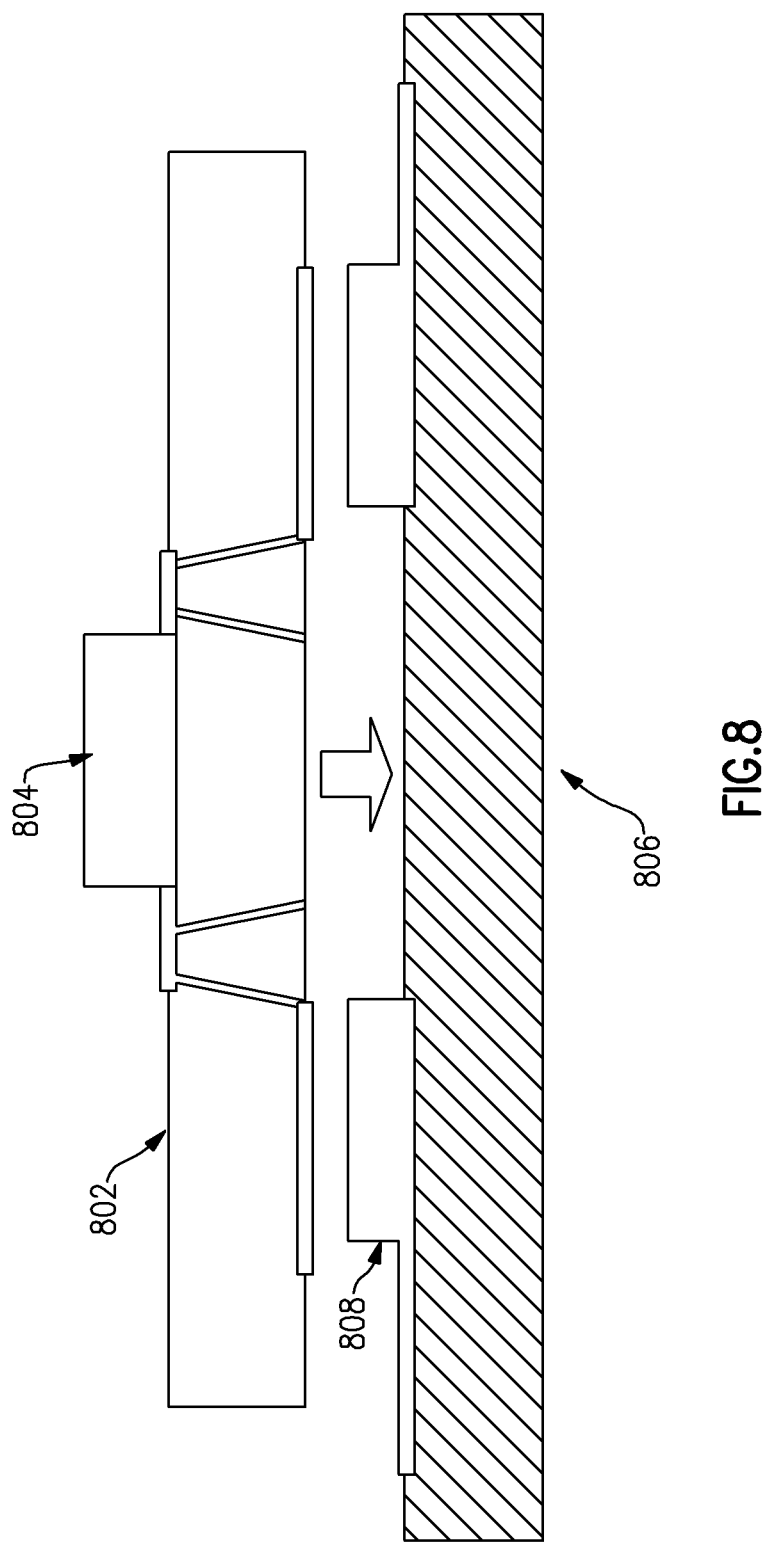

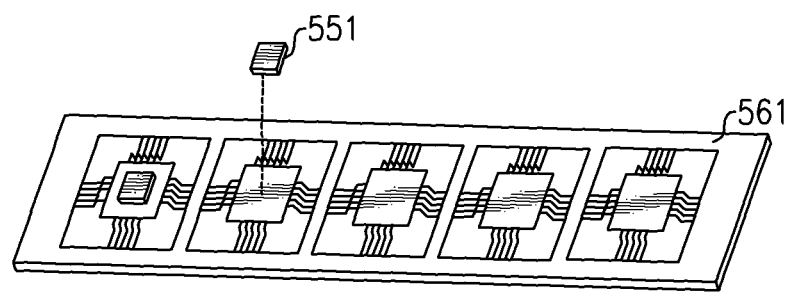
FIG.25A
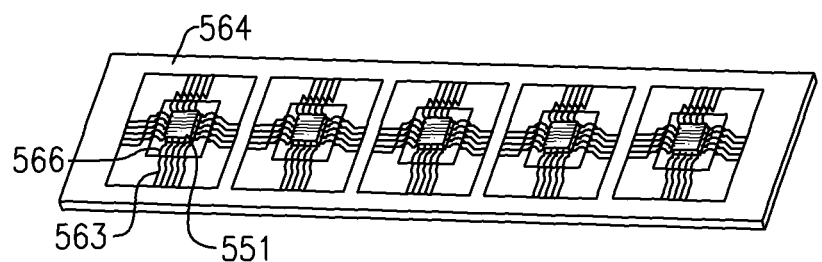
FIG.25B
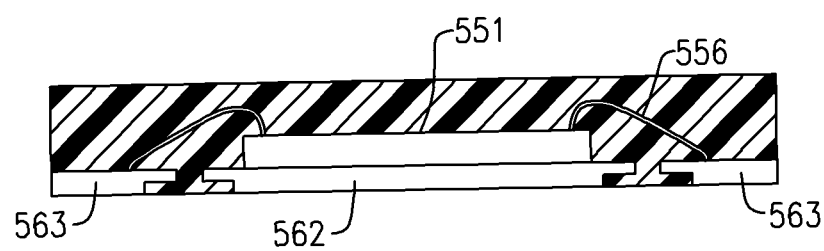
FIG.25C
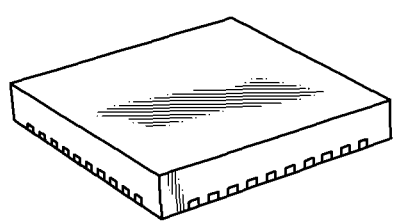 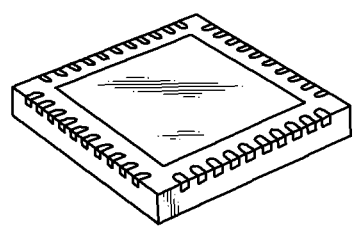
FIG.25D　　　　FIG.25E

GALLIUM ARSENIDE DEVICES WITH COPPER BACKSIDE FOR DIRECT DIE SOLDER ATTACH

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present disclosure generally relates to the field of semiconductor wafer processing technology. In particular, this disclosure relates to the design, fabrication, and manufacture of gallium arsenide (GaAs) integrated circuits.

Description of the Related Art

The use of GaAs substrates in the design and construction of integrated circuits has proven to have desirable effects. For example, GaAs substrates have been useful in achieving greater performance in power amplifier circuits. Typically, a GaAs integrated circuit will be used as a component in a larger circuit device or design. In order to be integrated into the circuit design, the GaAs integrated circuit is mechanically and electrically coupled to a printed circuit board for the circuit device. In other cases, the GaAs integrated device is mounted to other electronic devices.

Current processes for mounting a GaAs integrated circuit to a printed circuit board typically involves attaching a singulated GaAs die to a contact pad formed on the printed circuit board. The GaAs integrated circuit usually includes a gold contact layer which is adapted to couple with a die attach pad on the printed circuit board. Depositing the gold layer is a time-consuming and relatively inefficient process. Also, gold is an expensive material, increasing the cost for GaAs integrated circuit products. Finally, gold has a relatively high dissolution rate in solder, and therefore is not able to be soldered to the die attach pad of the device's printed circuit board. As such, the contact side of the GaAs integrated circuit is typically adhered to the die attach pad using a conductive adhesive, such as epoxy or solder paste. The use of conductive adhesive requires an additional manufacturing step, and also requires the use of larger pads to accommodate adhesive overflow. This requirement of excess dimensions limits the ability to further miniaturize components. However, even with these undesirable features, gold contact layer and conductive adhesive continue to be the standard material and procedure used for attaching GaAs integrated circuit dies to a substrate.

With increasing pressure to reduce the size of components in electronic devices, there is a need for reducing the required size of the die attach pad on a printed circuit board or other substrate. There is also a need for improved GaAs integrated circuits that employ less costly component materials and can be more efficiently manufactured. Furthermore, there is a need for improved processes and methods for manufacturing such GaAs integrated circuits.

Disclosed herein are embodiments of an electronic circuit device comprising a substrate, a die attach pad located on the substrate, and a GaAs integrated circuit die having a copper backside contact pad and having a footprint of approximately the same size as the die attach pad, the GaAs integrated circuit die being connected to the die attach pad by a solder layer, the solder layer being disposed between the copper backside contact pad and the die attach pad on the substrate in a manner such that the GaAs integrated circuit die self-aligns with the die attach pad after reflow of the solder layer.

In some embodiments, the electronic circuit can further comprise a barrier layer, said barrier layer being disposed between said copper backside contact pad and said solder layer. In some embodiments, said substrate can be a printed circuit board. In some embodiments, said solder barrier layer can comprise nickel. In some embodiments, said solder barrier layer can further comprise a palladium flash layer.

In some embodiments, thermal resistance of the solder layer can be at least 40% lower than thermal resistance of an epoxy layer. In some embodiments, the copper backside contact pad can have a thermal conductivity of approximately 4 W/cmK.

Also disclosed herein are embodiments of aa GaAs integrated circuit incorporating the electronic circuit device described herein.

Disclosed herein are embodiments of a method for manufacturing a GaAs wafer assembly, said method comprising fabricating a GaAs wafer having a copper layer over a backside of the wafer, electroless plating a barrier layer over said copper layer, forming at least one singulated die from said GaAs wafer, and direct die soldering said at least one singulated die to a die attach pad on a substrate such that a solder layer is formed between the at least one singulated die and the die attach pad, the soldering performed in a manner such that the at least one singulated die self-aligns with the die attach pad after reflow of the solder layer.

In some embodiments, the method can further comprise forming a palladium flash layer over the copper layer. In some embodiments, said substrate can be a printed circuit board. In some embodiments, a surface area of said singulated die can be substantially equivalent to a surface area of said die attach pad.

Also disclosed herein are embodiments of a GaAs integrated circuit made in accordance with the method disclosed herein. In some embodiments, said GaAs integrated circuit can comprise through-wafer via at least partially filled with copper. In some embodiments, the electroless plating can cover more than 40% of the through-wafer via.

Also disclosed herein are embodiments of an electronic circuit module comprising a singulated GaAs integrated circuit die having a copper contact pad, a printed circuit board having a die attach pad, said die attach pad sized to receive the singulated GaAs integrated circuit die and having a footprint of approximately the same size as the singulated GaAs integrated circuit die, and a solder layer disposed between said copper contact pad of the die and said die attach pad of the printed circuit board, said copper contact pad of the singulated GaAs integrated circuit die attached to said die attach pad of the printed circuit board in a manner such that the singulated GaAs integrated circuit die self-aligns with the die attach pad after reflow of the solder layer.

In some embodiments, the module can further comprise a nickel layer, said nickel layer formed between said copper contact pad and said solder layer. In some embodiments, the module can further comprise a flash palladium layer, said flash palladium layer formed between said nickel layer and said copper contact pad and configured to act as a wetting layer for the solder layer. In some embodiments, the size of said die attach pad may not exceed the size of said singulated GaAs integrated circuit die by more than 150 microns in at least one direction. In some embodiments, said singulated GaAs integrated circuit die can be a radio frequency integrated circuit die.

SUMMARY OF THE INVENTION

Systems and methods for reducing the required size of die attach pads adapted to receive GaAs integrated circuit dies on printed circuit boards and other substrates are disclosed herein. The systems and methods are designed to effectively attach a singulated GaAs integrated circuit die to a die attach pad on a substrate, such as a printed circuit board, without using a conductive adhesive. The direct die attach systems and methods disclosed herein eliminate the need to use larger die attach pads to accommodate adhesive overflow and the like.

In one embodiment, an electronic circuit device incorporating a direct die attach system is provided. The device includes a GaAs integrated circuit die having a copper backside contact pad, a substrate having a die attach pad, and a solder layer. The solder layer is preferably disposed between the copper backside contact pad on the GaAs integrated circuit and the die attach pad on the substrate in a manner such that the solder layer attaches the integrated circuit die to the substrate. In one implementation, the device further includes a solder barrier layer that is disposed between the copper backside contact pad and the solder layer. The solder barrier layer may include nickel and/or a palladium flash layer. In some implementations, the barrier layer may have low electrical resistance and low stress. In another implementation, the copper backside contact pad is substantially the same size as the die attach pad. The substrate can be a printed circuit board or the like.

In another embodiment, a method for manufacturing a GaAs wafer assembly is disclosed. The method includes providing a GaAs wafer having a copper layer over the backside of the wafer. Next, a solder barrier layer is formed over the copper layer. A singulated die from the wafer is soldered to a die attach pad on a substrate. In some embodiments, forming the solder barrier layer comprises forming a nickel layer over the copper layer. In some embodiments, the method further includes forming a palladium flash over the copper layer. In some embodiments, the substrate can be a printed circuit board. In some embodiments, the surface area of the singulated die can be substantially equivalent to the surface area of the die attach pad.

Semiconductor integrated circuits can be made in accordance with the methods disclosed herein. In some embodiments, the integrated circuit is incorporated in a wireless telecommunication device. In some embodiments, the integrated circuit comprises a copper filled through wafer via, or a through-wafer via at least partially filled with copper. In some embodiments, the integrated circuit comprises a copper contact pad.

In yet another embodiment, an electronic circuit module incorporating a direct die attachment assembly is disclosed. The electronic circuit module includes a singulated GaAs integrated circuit having a copper contact pad, a printed circuit board having a die attach pad, and a solder layer. The die attach pad is sized to receive the singulated GaAs integrated circuit die. In one implementation, the copper contact pad is attached to the singulated GaAs integrated circuit die by the solder layer. In another implementation, the size of the die attach pad does not exceed the size of the singulated GaAs integrated circuit die by more than 150 microns in at least one direction.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 8 is a schematic drawing of solder die attach of GaAs dies according to one embodiment

FIGS. 25A-25E show examples of structures at various stages of the processing sequence of FIG. 23, according to another embodiment.

DETAILED DESCRIPTION OF THE PREFERRED EMBODIMENT

The headings provided herein, if any, are for convenience only and do not necessarily affect the scope or meaning of the claimed invention.

Various embodiments of the present disclosure relate to novel methods and systems for attaching a singulated GaAs die to a substrate such as a printed circuit board. In some embodiments, an electroless Ni process can be used for GaAs dies, such as those used in power amplifier fabrication. The Ni can act as a barrier between Cu backside metallization for GaAs through wafer via process and the solder die attach material. Ni thickness can be optimized to adequately serve as a barrier to prevent intermixing of Cu and Sn and thus intermetallic compound formation, while at the same time not adding too much stress to cause wafer warpage. The minimized Ni thickness also reduces the possibility that the added magnetic property of plated Ni would impact the functionalities of the GaAs devices for RF applications.

Before being shipped to a customer, semiconductor dies can be fully tested, singulated from a wafer, and packaged. Unlike in the silicon industry, in which wafer level packaging is the norm, in compound semiconductor industry, particularly GaAs power amplifier manufacturing, die attachment is still in the mainstream of every fabrication. Die attachment is a process to pick a die from a diced wafer and attach it onto, for example, a lead frame or into a package. A GaAs die is typically attached to a die attach pad by conductive epoxy or solder paste. However, there are serious disadvantages to the use of epoxy or solder paste.

Compared to epoxy die attach, direct die solder ("DDS") of GaAs dies onto frames can have many advantages. For example, solder offers higher electrical and thermal conductivities, which can be advantageous for high power applications. Further, solder offers higher bonding strength, less die tilting, and less die rotation during die attach process.

Additionally, with direct die solder, the typical "runaway" area for epoxy die attach can be eliminated to reduce the size of the package. In a typical assembly process using epoxy die attach, surface mounts are picked and placed separately and soldered on the lead frame. A GaAs die is then picked and placed next and attached by epoxy, which goes through a curing process instead reflow. Using direct die solder, both surface mounts and the GaAs die can be soldered together during the same reflow process. This can be advantageous for meeting the demands of increased level of integration, reduced package size, and higher volume production in compound semiconductor industry in recent years.

Figure 1:
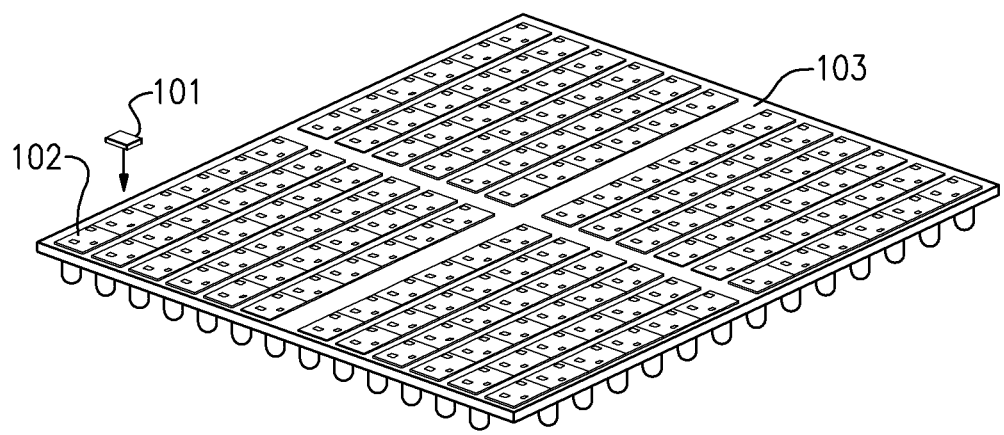
FIG. 1 shows an example of attaching a singulated GaAs die to a die attach pad on a substrate.

As described in greater detail below, the methods and systems involve directly attaching a singulated GaAs die 101 to a die attach pad 102 on a substrate 103 as shown in FIG. 1 without using conductive adhesive such as epoxy. The elimination of adhesive significantly reduces the need for forming a die attach pad with larger dimensions than the singulated die. In some embodiments, the die attach pad can be identically sized to the singulated die. The novel die attach methods and systems described herein reduce the footprint of the mounted die, thereby facilitating further module size reduction.

Figure 2A:
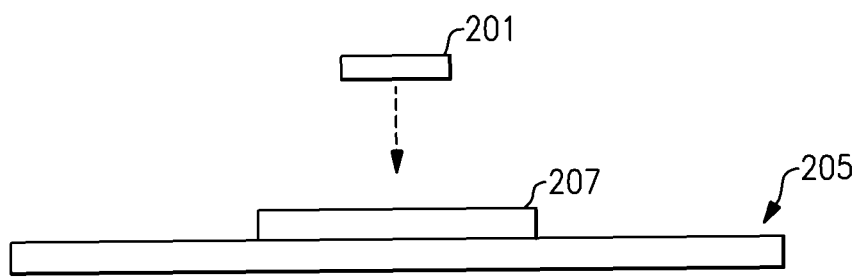
FIGS. 2A-2B show an example sequence of attaching a GaAs die to a substrate using standard processes.
Figure 2B:
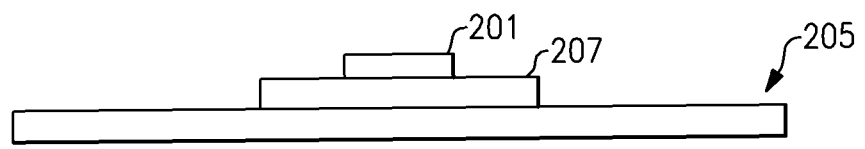

FIGS. 2A-2B show an example sequence of attaching a GaAs die to a substrate using standard processes that incorporate the use of a conductive adhesive to attach the die to the substrate. As illustrated, a singulated GaAs die 201 is arranged to be attached to a substrate 205 by die attach pad 207 via a conductive adhesive such as epoxy. The substrate 205 is preferably a printed circuit board for an electronic device. Typically, the dimensions of the die attach pad 207 exceed the dimensions of the die 201 itself, in order to allow room for adhesive to spread laterally. The larger dimensions of the die attach pad 207 effectively expand the footprint of the device, and hinder efforts toward increased miniaturization.

Figure 3A:
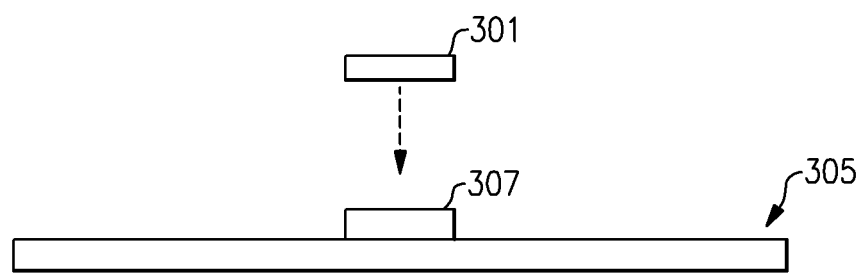
FIGS. 3A-3B show an example sequence of attaching a GaAs die to a substrate using a direct die solder process.
Figure 3B:
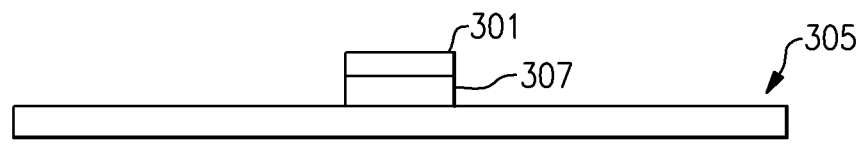

FIGS. 3A-3B show an example sequence of attaching a GaAs die to a substrate using a direct die attach method in accordance with various preferred embodiments of the present invention. In contrast to the sequence illustrated in FIGS. 2A-2B, the die attach pad 307 has the same width as the singulated die 301. This can be achieved by the use of direct die solder (DDS), as opposed to epoxy. Since solder is less prone to lateral flow during the attachment process, the die attach pad 307 can have the same footprint as the singulated die 301. This advantageously reduces the footprint of the device, and allows for reduced component sizes. Further, soldering offers higher bond strength, less die tilting, and less die rotation during a die attach process. However, it is impractical to implement the sequence illustrated in FIGS. 3A-3B for conventional GaAs integrated circuits having a gold contact layer because of the difficulties in soldering gold due to gold's relative high dissolution rate in solder. Accordingly, in certain preferred embodiments described in greater detail below, the inventors have developed methods and systems for replacing gold with copper as backside contact for GaAs integrated circuits in order to implement the direct die attach methods described herein.

Provided herein are various methodologies and devices for processing GaAs wafers to form GaAs integrated circuits that are subsequently mounted to printed circuit boards or other devices using a direct die attach process.

In the description herein, various examples are described in the context of GaAs substrate wafers. It will be understood, however, that some or all of the features of the present disclosure can be implemented in processing of other types of semiconductor wafers. Further, some of the features can also be applied to situations involving non-semiconductor wafers.

Figure 4:
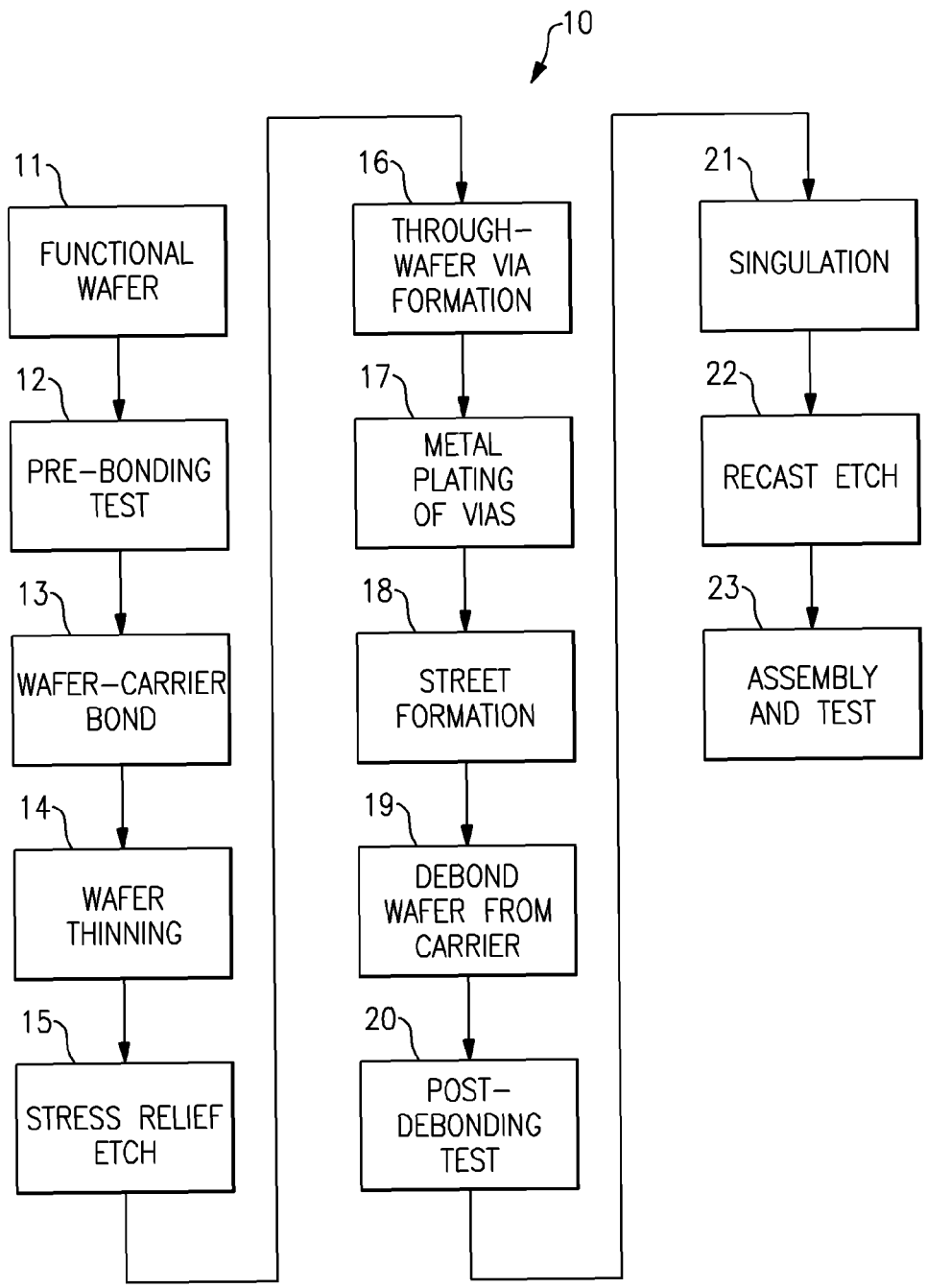
FIG. 4 shows an example sequence of wafer processing for forming singulated GaAs dies for attachment to a substrate.

FIG. 4 shows an example of a process 10 where a functional GaAs wafer is processed to form GaAs integrated circuit dies and the formed integrated circuit dies are singulated for assembly, which includes direct die attachment to a printed circuit board or other device without using a conductive adhesive.

Figure 5A:
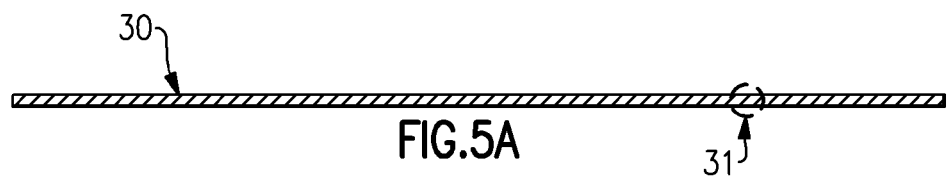
FIGS. 5A-5R show examples of structures at various stages of the processing sequence of FIG. 4.
Figure 5B:
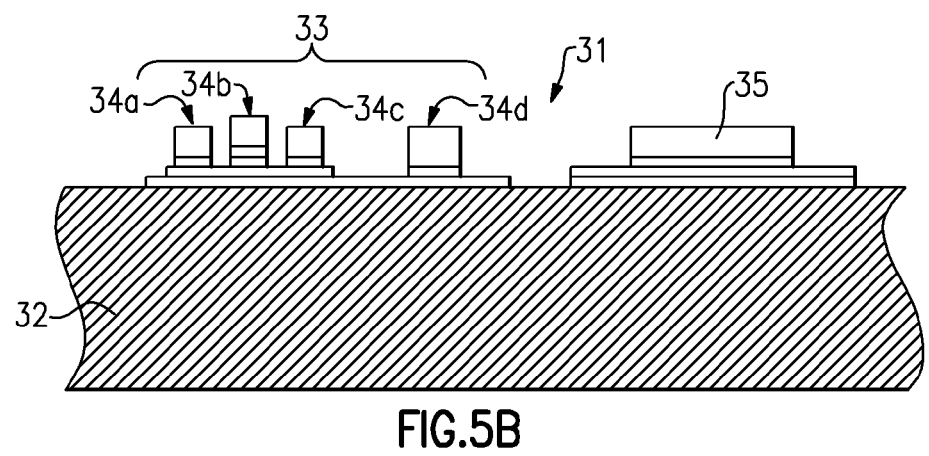
Figure 5C:
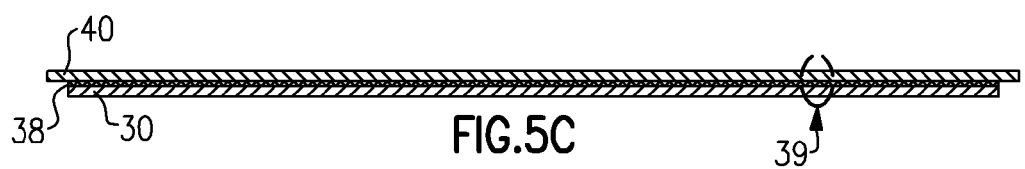

In the process 10 of FIG. 4, a functional wafer is provided (block 11). FIG. 5A depicts a side view of such a wafer 30 having first and second sides. The first side can be a front side, and the second side a back side. FIG. 5B depicts an enlarged view of a portion 31 of the wafer 30. The wafer 30 can include a substrate layer 32 (e.g., a GaAs substrate layer). The wafer 30 can further include a number of features formed on or in its front side. In the example shown, a transistor 33 and a metal pad 35 are depicted as being formed the front side. The example transistor 33 is depicted as having an emitter 34b, bases 34a, 34c, and a collector 34d. Although not shown, the circuitry can also include formed passive components such as inductors, capacitors, and source, gate and drain for incorporation of planar field effect transistors (FETs) with heterojunction bipolar transistors (HBTs). Such structures can be formed by various processes performed on epitaxial layers that have been deposited on the substrate layer.

Referring to the process 10 of FIG. 4, the functional wafer of block 11 can be tested (block 12) in a number of ways prior to bonding. Such a pre-bonding test can include, for example, DC and RF tests associated with process control parameters. Upon such testing, the wafer can be bonded to a carrier (block 13). FIG. 4C shows an example assembly of the wafer 30 and a carrier 40 (above the wafer) that can result from the bonding step 13.

Referring to the process 10 of FIG. 4, the wafer—now mounted to the carrier plate—can be thinned so as to yield a desired substrate thickness in blocks 14 and 15.

Figure 5D:
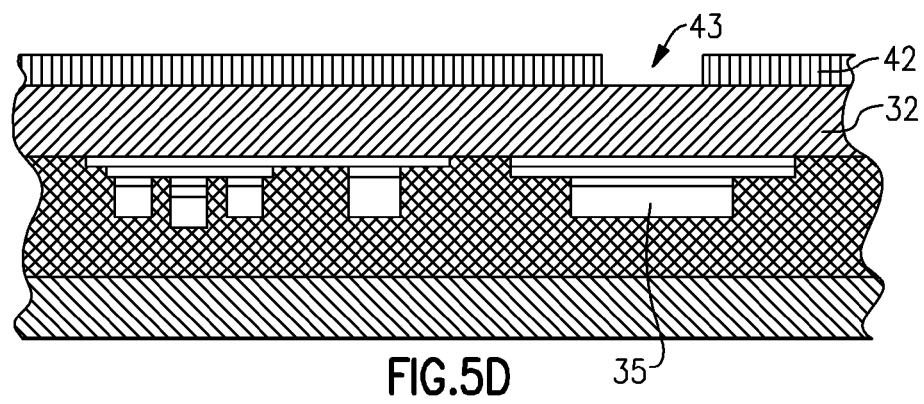
Figure 5E:
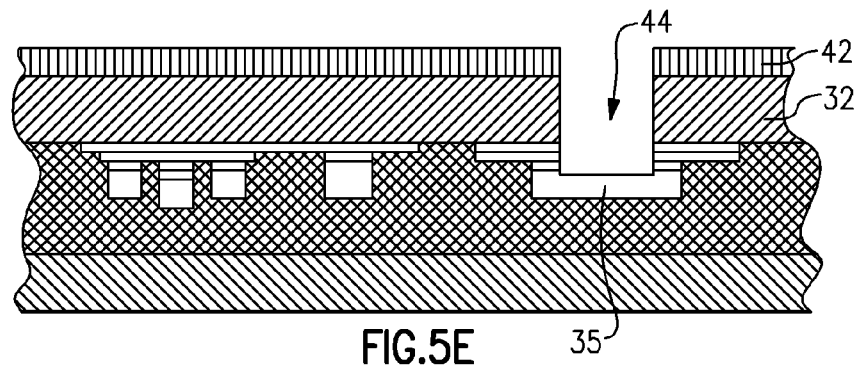
Figure 5F:
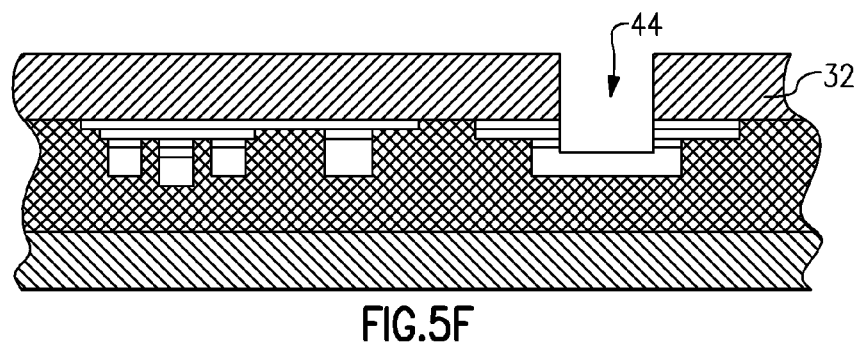

Referring to the process 10 of FIG. 4, the thinned and stress-relieved wafer can undergo a through-wafer via formation process (block 16). FIGS. 5D-5F show different stages during the formation of a via 44. Such a via is described herein as being formed from the back side of the substrate 32 and extending through the substrate 32 so as to end at the example metal pad 35. It will be understood that one or more features described herein can also be implemented for other deep features that may not necessarily extend all the way through the substrate. Moreover, other features (whether or not they extend through the wafer) can be formed for purposes other than providing a pathway to a metal feature on the front side.

Figure 5G:
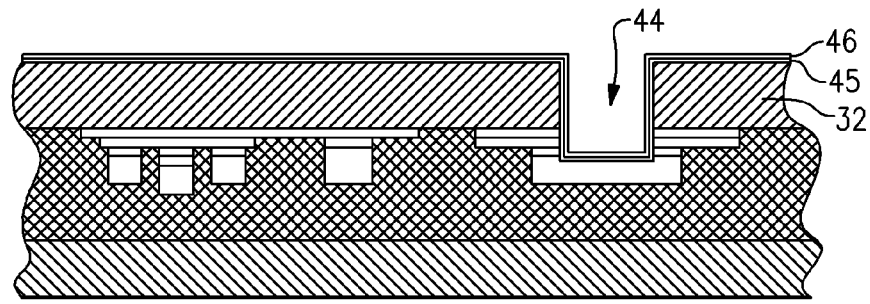
Figure 5H:
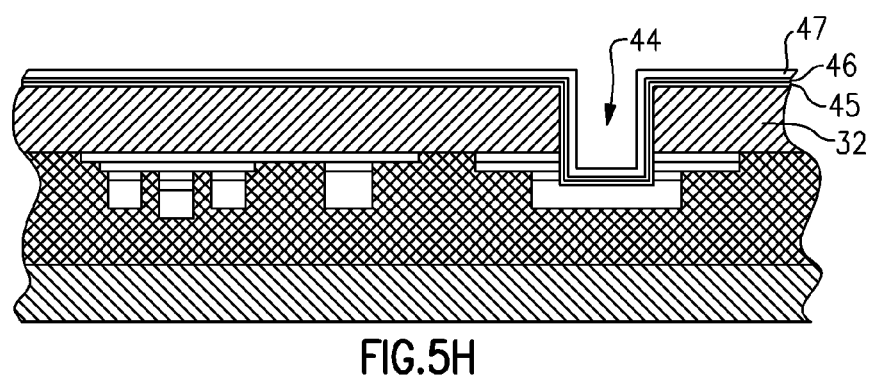

Referring to the process 10 of FIG. 4, a metal layer can be formed on the back surface of the substrate 32 in block 17. FIGS. 5G and 5H show examples of adhesion/seed layers and a thicker metal layer.

FIG. 5G shows that in certain implementations, an adhesion layer 45 such as a nickel vanadium (NiV) layer can be formed on surfaces of the substrate's back side and the via 44 by, for example, sputtering. FIG. 5G also shows that a seed layer 46 such as a thin gold layer can be formed on the adhesion layer 45 by, for example, sputtering. Such a seed layer facilitates formation of a thick metal layer 47 such as a thick gold layer shown in FIG. 5H. In certain implementations, the thick gold layer can be formed by a plating technique.

The metal layer formed in the foregoing manner forms a back side metal plane that is electrically connected to the metal pad 35 on the front side. Such a connection can provide a robust electrical reference (e.g., ground potential) for the metal pad 35. Such a connection can also provide an efficient pathway for conduction of heat between the back side metal plane and the metal pad 35.

Figure 5I:
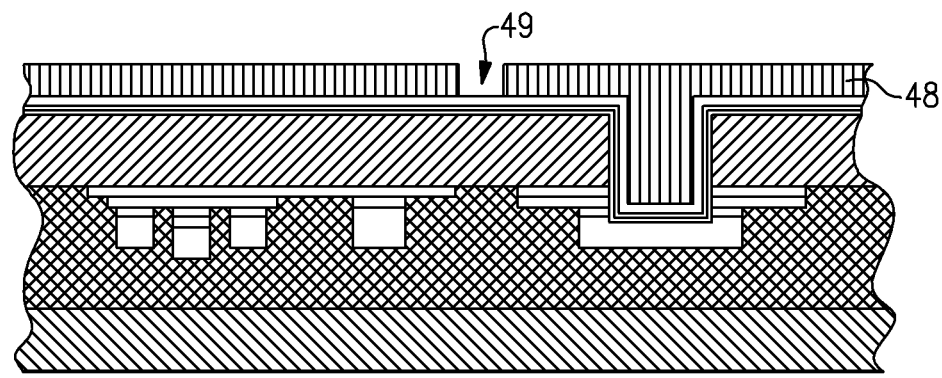
Figure 5J:
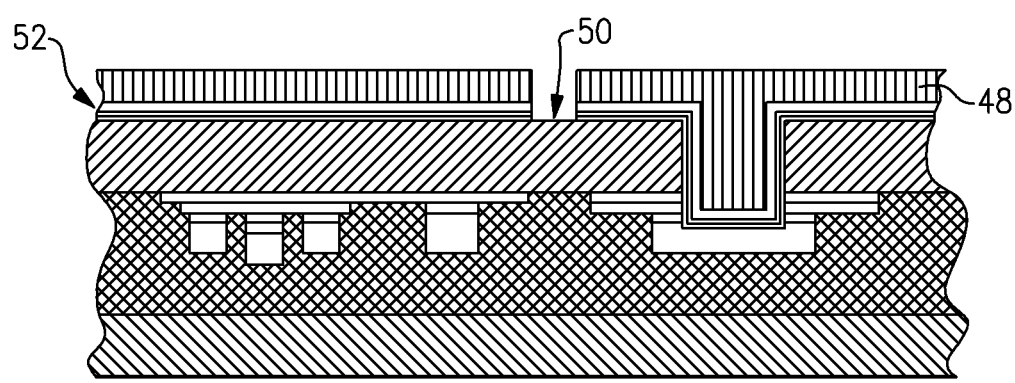
Figure 5K:
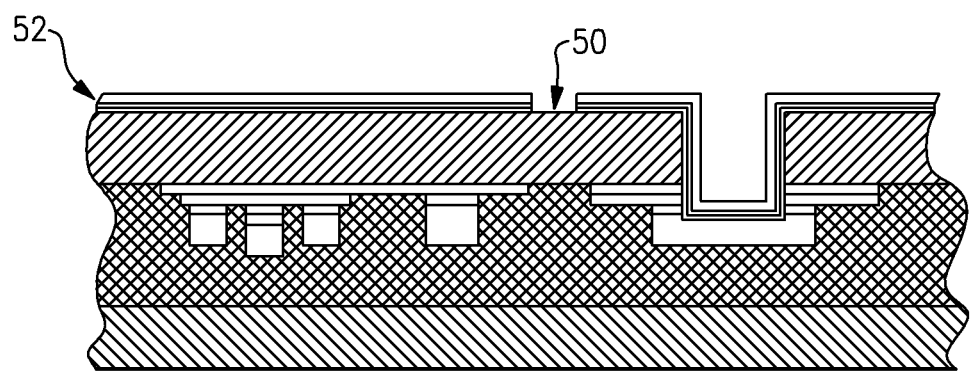

Referring to the process 10 of FIG. 3, the wafer having a metal layer formed on its back side can undergo a street formation process (block 18). FIGS. 5I-5K show different stages during the formation of a street 50. Such a street is described herein as being formed from the back side of the wafer and extending through the metal layer 52 to facilitate subsequent singulation of dies.

Figure 5L:
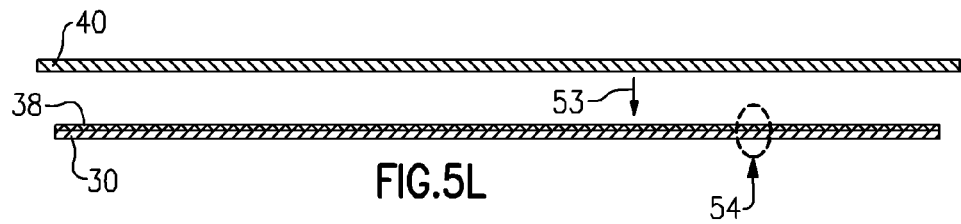
Figure 5M:
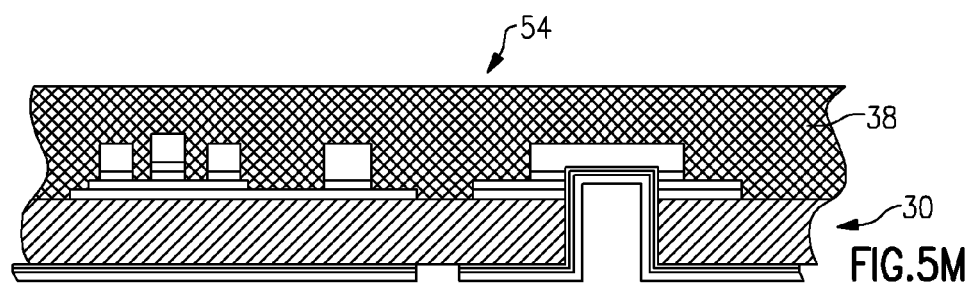
Figure 5N:
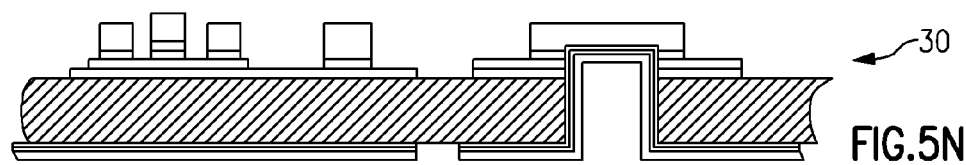
Figure 5O:
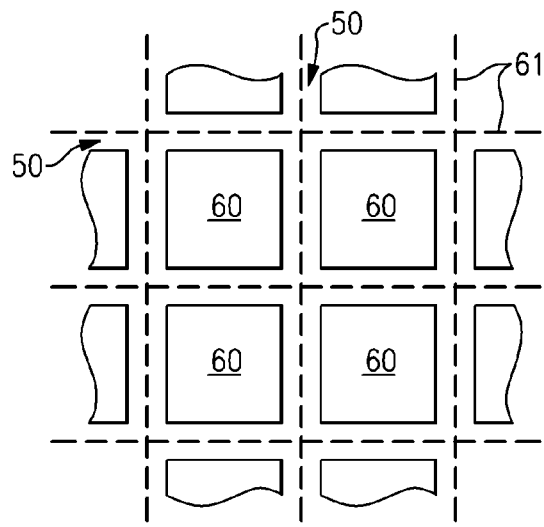

To form a street 50 (FIG. 5J) through the metal layer 52, techniques such as wet etching (with chemistry such as potassium iodide) can be utilized. FIG. 5K shows the formed street 50, with the resist layer 48 removed. In the example back-side wafer process described in reference to FIGS. 4 and 5, the street (50) formation and removal of the resist (48) yields a wafer that no longer needs to be mounted to a carrier plate. Thus, referring to the process 10 of FIG. 4, the wafer is debonded or separated from the carrier plate in block 19. FIGS. 5L-5N show different stages of the separation and cleaning of the wafer 30.

Referring to the process 10 of FIG. 4, the debonded wafer of block 19 can be tested (block 20) in a number of ways prior to singulation.

Referring to the process 10 of FIG. 4, the tested wafer can be cut to yield a number of dies (block 21). In certain implementations, at least some of the streets (50) formed in block 18 can facilitate the cutting process. FIG. 50 shows cuts 61 being made along the streets 50 so as to separate an array of dies 60 into individual dies. Such a cutting process can be achieved by, for example, a diamond scribe and roller break, saw or a laser.

Figure 5P:
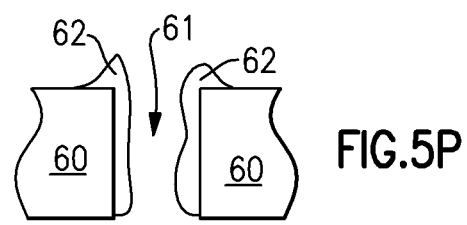

In the context of laser cutting, FIG. 5P shows an effect on the edges of adjacent dies 60 cut by a laser. As the laser makes the cut 61, a rough edge feature 62 (commonly referred to as recast) typically forms. Presence of such a recast can increase the likelihood of formation of a crack therein and propagating into the functional part of the corresponding die.

Figure 5Q:
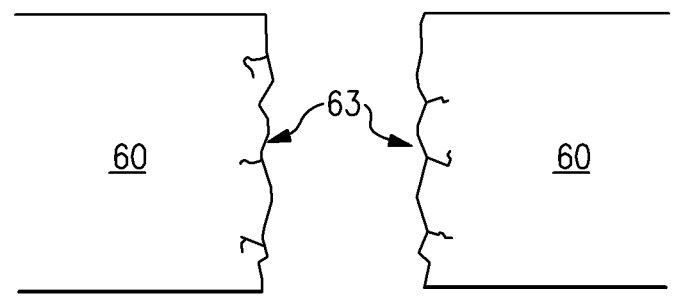
Figure 5R:
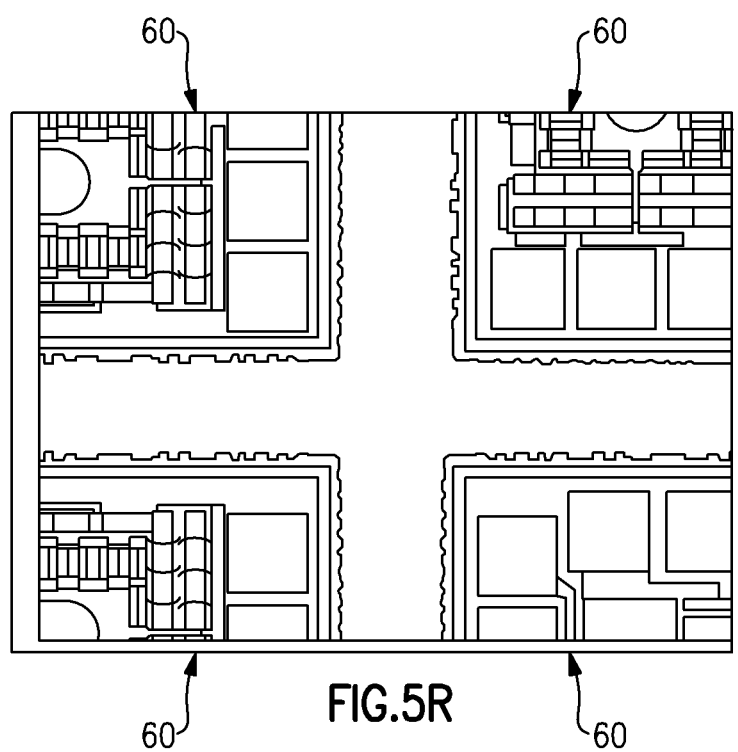

Thus, referring to the process 10 in FIG. 4, a recast etch process using acid and/or base chemistry (e.g., similar to the examples described in reference to block 15) can be performed in block 22. Such etching of the recast feature 62 and defects formed by the recast, increases the die strength and reduces the likelihood of die crack failures (FIG. 5Q).

Referring to the process 10 of FIG. 4, the recast etched dies (FIG. 5R) can be further inspected and subsequently attached to a printed circuit board or other substrate. In certain embodiments, the singulated dies 60 are preferably directly attached to a contact pad on a printed circuit board using solder. Since it is difficult to solder gold, the inventors have developed methodologies to use copper, instead of gold, as backside contact for GaAs integrated circuits in conjunction with the direct die solder approach in attaching the singulated dies to a substrate.

Copper Metallization

GaAs wafers can undergo a backside processing before packaging, including wafer thinning, via formation, and metallization. Backside metallization not only provides an electrical ground plane, but also functions as a heat sink to GaAs devices on the front side of the wafer.

While metallization of backside contact of GaAs integrated circuits is typically performed using gold, other integrated circuit technologies, such as silicon-based technologies, use copper (Cu) for a contact layer. Cu has superior conductivity, may be applied more uniformly, and is less costly than gold. Further, Cu has a sufficiently low dissolution rate in solder, so allows the integrated circuit device to be soldered to its printed circuit board pad. Cu, however, readily oxidizes, which degrades electrical and mechanical characteristics. Accordingly, when used in silicon processes, the Cu is typically applied in thick layers, polished, and then capped with dielectric materials such as silicon nitride to avoid these oxidation effects.

Although Cu has been used successfully in silicon wafer technology, to the best of the inventors' knowledge, Cu has not been successfully used in GaAs integrated circuit devices. A number of obstacles have hindered the effective use of copper in metallization of GaAs devices. For example, Cu is an unintentional source of impurity, and is often proven to be the leading cause of GaAs device failures. Cu rapidly diffuses into GaAs substrates, at a rate faster than the diffusion of gold into GaAs substrates, and faster than the diffusion of Cu into silicon substrates. Once Cu diffuses into source/gate/drain region of a field effect transistor (FET) or active areas of a heterojunction bipolar transistor (HBT), the device will degrade, and eventually fail electrically. Unlike gold, Cu can diffuse into GaAs and create deep energy levels in the GaAs band gap region. These deep levels will trap charges, which lead to degradation and failure of the GaAs devices.

Without wishing to be bound by theory, the inventors have determined that there are three mechanisms of Cu diffusion in GaAs. The first is bulk or lattice diffusion, which involves vacancies in the GaAs lattice and the exchange of Cu atoms between layers in the GaAs lattice. Bulk diffusion is highly temperature dependent. The second mechanism is the intermetallic compound formation between Cu and GaAs. The third mechanism is interstitial diffusion, in which Cu atoms move along defects, dislocations, or grain boundaries in GaAs. This third mechanism is of particular importance because during processing, the GaAs surface is often damaged. Consequently, there are voids, dislocations, and other defects present on the GaAs surface, which facilitate the movement of Cu atoms within the GaAs lattice structure.

Accordingly, the use of Cu typically results in the destruction or nonoperation of GaAs integrated circuits. Further, Cu readily oxidizes, and so is difficult to use as a contact material in GaAs integrated circuits without any protection. It is therefore necessary to modify the process outlined above in order to permit the use of Cu to form the metal layer lining the back side of the wafer and the surface of the vias. Certain aspects of the present invention are directed to novel process modifications and techniques which the inventors have developed to overcome at least some of the obstacles in using copper for backside metallization of GaAs integrated circuits. A backside metallization process developed for copper will be first described below.

Figure 6:
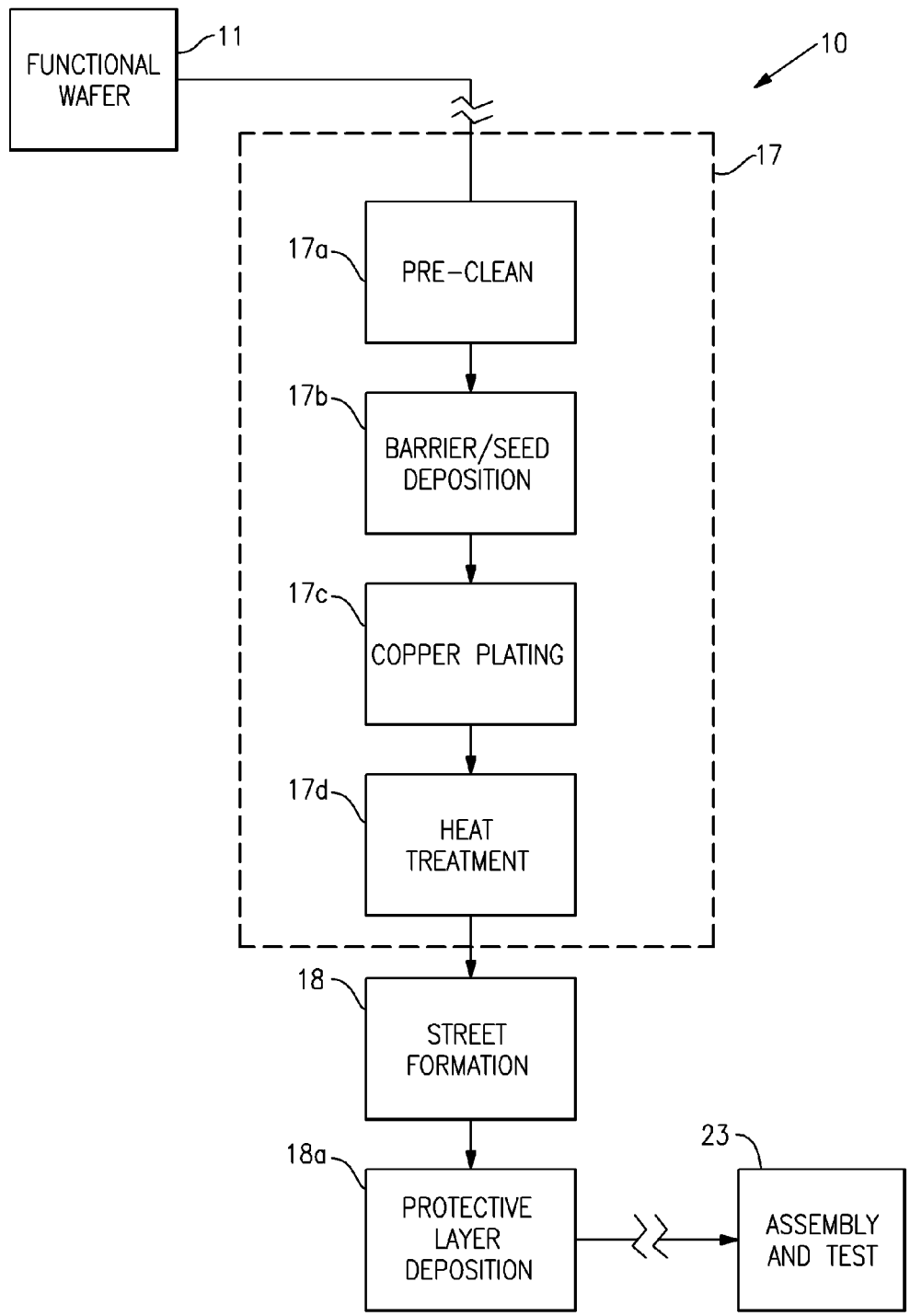
FIG. 6 is a block diagram representing the copper metallization process according to various aspects of the present invention.

FIG. 6 shows one embodiment of a modified via metallization process represented in Block 17 of FIG. 4, which is developed for copper metallization of a GaAs integrated circuit. FIGS. 7A-7D show examples of cross sectional diagrams of a section of a GaAs wafer formed in accordance the process shown in FIG. 6.

Figure 7A:
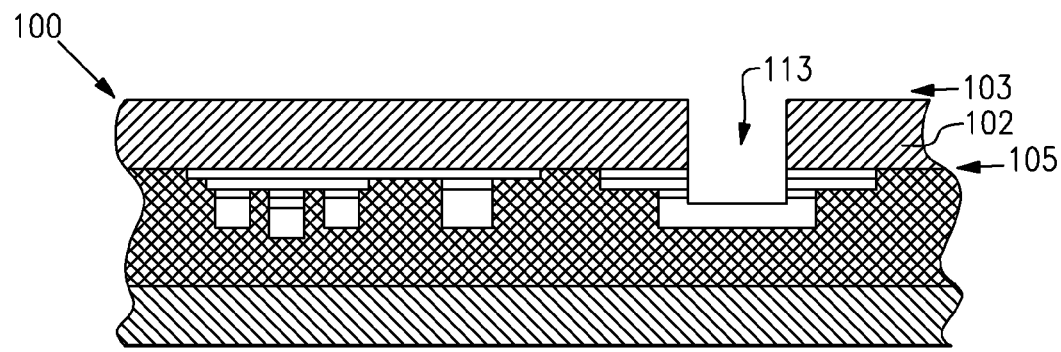
FIGS. 7A-7D show examples of structures at various stages of the processing sequence of FIG. 6.

In the process 10 of FIG. 6, the via metallization process (block 17) begins with a pre-clean step (block 17a). FIG. 7A depicts the formed via 113 processed through the pre-clean step 17a. In various implementations, the pre-clean step removes residues and other contamination from the via 113 and back surface 103 of the substrate 102 and activates the surfaces for subsequent metal adhesion.

Figure 7B:
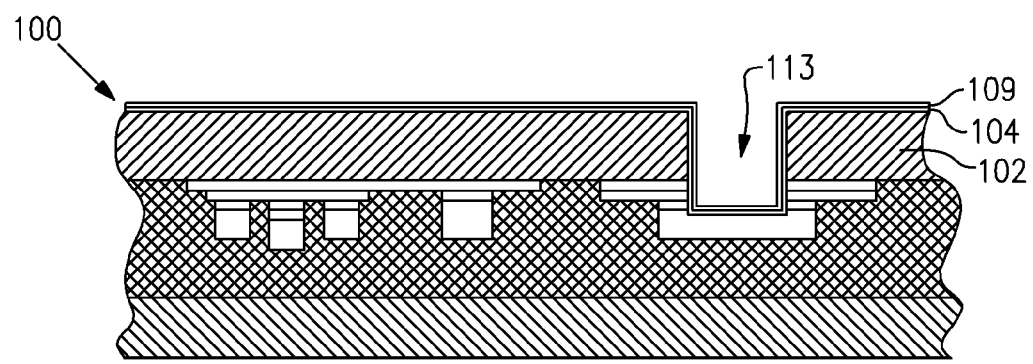

Referring to the process 10 of FIG. 6, a metal barrier and seed layer can be formed in the via 113 and on the back surface 103 of the substrate 102 in block 17b. FIG. 7B shows an example of a seed layer 109 and a metal barrier layer 104 that can be formed in the via 113 and on the back surface 103 of the substrate 102.

Figure 7C:
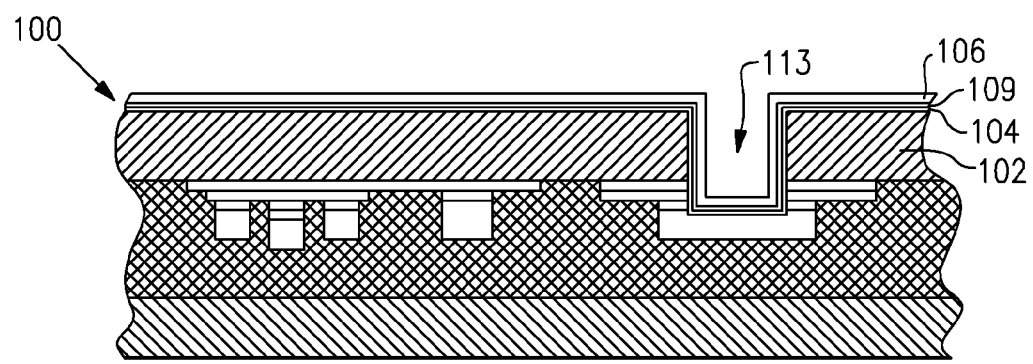

Referring to the process 10 of FIG. 6, a copper layer is formed in the via 113 and on the back surface 103 of the substrate 32 in block 17c. FIG. 7C shows an example of a copper contact layer 106 that can be formed in the via 113 and on the back surface 103 of the substrate 102. The copper contact layer 106 can replace some or all of the gold contact layer that is typically deposited in the via 113 and on the back surface 103. As FIG. 6 further shows, in some embodiments, an optional heat treatment step in block 17d can follow the copper deposition process.

In some implementations of the embodiment shown in FIG. 6, the via metallization process (blocks 17a-17d) is followed by street formation (block 18), and deposition of a protective layer deposition (block 18a) before debonding wafer from carrier.

FIGS. 7A-7D show examples of cross sectional diagrams of a section of a GaAs wafer with a via formed in accordance with embodiments of the process 10 in FIG. 3 is illustrated. Section 100 has via 113 extending through a GaAs substrate 102. Referring to the process 10 of FIG. 3, the via 113 may be pre-cleaned (block 17a). The via 113 and back side 105 of the GaAs wafer 102 may be cleaned using, for example HCl and/or an $O_2$ plasma ash process.

Following cleaning, the via may be barrier layer followed by a seed layer may be deposited (block 17b). First a barrier layer 104 is deposited on the contact side 105 of the GaAs substrate 102. In one example, the barrier layer 104 is a nickel vanadium (NiV) layer disposed at about 800 angstroms thickness. The NiV may be deposited using a physical vapor deposition process (commonly known as sputtering), or other known deposition process. The NiV provides an effective diffusion barrier between the GaAs substrate and the copper contact layer 106, which will be applied later. Since copper is known to have an undesirable diffusion effect on GaAs, the NiV is deposited in a relatively thick layer. It will be appreciated that the thickness of the layer may be adjusted according to the needs of the particular application. For example, devices subjected to long-term use may require thicker layers, and the layer may be adjusted according to other material used, for example, in the seed layer 109.

A seed layer 109 may then be deposited on the barrier layer 104. Although the seed layer 109 may not always be necessary, it has been found that a seed layer facilitates better mechanical and electrical connection of the copper contact layer. The metal seed layer may be, for example, either a copper layer or a gold layer, and may be deposited at a thickness of about 700 angstroms using a physical vapor deposition process. If copper is used as the seed layer, then an activation process may need to be performed at a later time if the copper has been allowed to oxidize.

The via 113 may then be plated with copper (block 17c). The copper contact layer 106 is deposited on the seed layer 109, if present. The copper contact layer 106 is deposited using an electroplating process. The copper is deposited at a relatively uniform thickness, such as about 6 µm. It will be appreciated that other types of processes and thicknesses may be used. Depending on the size of the via 113, the copper may simply coat the walls, or may nearly fill the via. To facilitate faster production, a 6 µm coating of the copper contact layer 106 typically provides sufficient electrical conduction, while leaving a central opening in via 113.

Following the copper plating, the GaAs wafer 102 is subjected to an optional heat treatment (block 17d). The metallization process can continue for 48 hours or more. Such a long process disadvantageously extends production time GaAs integrated circuit devices. Additionally, this slow process results in copper structure with significant defects, cracks, etc caused by the slow growth. Adding heat to the process both significantly accelerates the metallization process and increase the quality and uniformity of the copper grain structure. In typical PECVD processes, the heat treatment involves application of temperatures between 200 to 300° C. These temperatures may exceed the melting point for the adhesive used to bond the wafer to the carrier. Subjecting GaAs wafers mounted onto carriers to such high temperatures may therefore disadvantageously decrease the bonding strength of the carrier and wafer. Accordingly, in certain embodiments the GaAs device is subjected to a temperature of approximately 100° C. Once the GaAs has been subjected to heat treatment, the metallization (block 17) of via 113 is complete. In some embodiments, the metallization (block 17) of via 113 is complete without heat treatment.

Referring to the process 10 of FIG. 6, the GaAs wafer having a copper contact layer 106 formed on its back side 105 can undergo a street formation process (block 18). Such a street is described herein as being formed from the back side of the wafer and extending through the copper contact layer 106 to facilitate subsequent singulation of dies. It will be understood that one or more features described herein can also be implemented for other street-like features on or near the back surface of the wafer. Moreover, other street-like features can be formed for purposes other than to facilitate the singulation process.

The street can be formed as described above with respect to FIG. 4 and FIGS. 5I-5K. An etch resist layer defining a street opening can be formed using standard photolithography. Next, the exposed street opening in the copper contact layer 106 may be etched using wet etching, although other etching processes are also possible. A pre-etching cleaning process (e.g., $O_2$ plasma ash) can be performed prior to the etching process. In various implementations, the thickness of the resist and how such a resist is applied to the back side of the wafer can be important considerations to prevent certain undesirable effects, such as via rings and undesired etching of via rim during the etch process.

After etching the street into copper contact layer 106, the resist layer may be removed, using photoresist strip solvents such as NMP (N-methyl-2-pyrrolidone), applied using, for example, a batch spray tool. To remove residue of the resist material that may remain after the solvent strip process, a plasma ash (e.g., $O_2$) and/or aqueous wash process can be applied to the back side of the wafer.

Following street formation (block 18), a protective layer 108 may be deposited over the back side of the GaAs wafer (block 18a). Since copper is highly reactive with oxygen, a protective layer 108 is deposited over the copper contact layer 106. In one example, the protective layer 108 is an organic solder preservative (OSP). The OSP may be applied using a bath process, or other known processes may be used. The OSP may be deposited at a thickness of about 700 angstroms. It will be appreciated that other thicknesses may be used depending upon application specific requirements and the particular materials used. For example, thicknesses in the range of about 100 angstroms to about 900 angstroms have been found to be effective, although other thicknesses may be alternatively used.

Figure 7D:
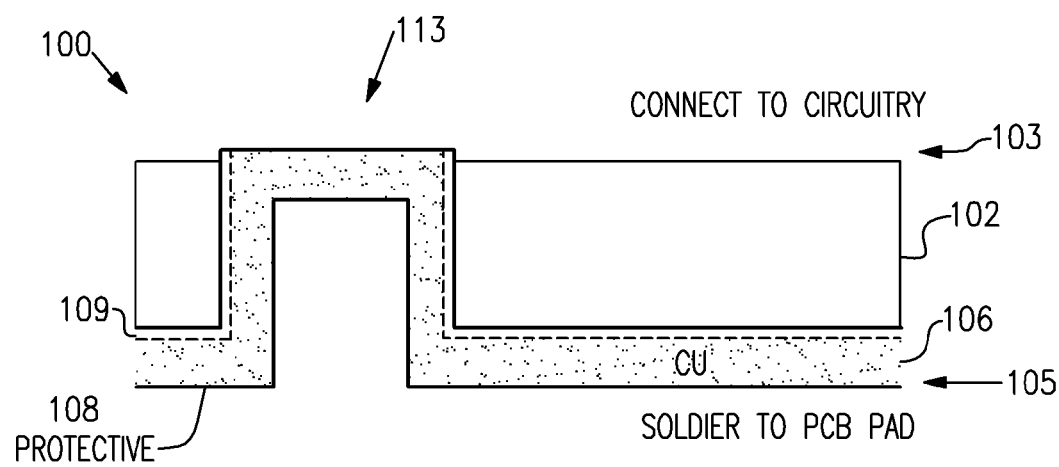

As described in more detail above, street formation (block 18) may be followed by debonding the wafer from the carrier (block 19), and testing the wafer following debonding (block 20). The resulting structure is shown in FIG. 7D.

Direct Die Solder

Current processes for attaching a singulated die to a substrate rely on conductive adhesives such as epoxy. For example, a singulated GaAs die can be attached to a die attach pad on a printed circuit board (PCB) using epoxy. Due to the tendency of epoxy to spread during the attachment process, the size of the die attach pad on the PCB typically exceeds the size of the GaAs die by at least 150 microns in each direction.

Direct die solder (DDS) is a process that uses solder to attach a singulated die to a die attach pad, rather than epoxy. DDS is a self-aligned process, such that during reflow solder only wets where there is a metal pad underneath. As solder has less tendency to spread laterally during this process (e.g., less runaway), the need for a die attach pad with larger dimensions than the singulated die. Accordingly, using DDS a die attach pad can be used that is identically sized to the singulated die. This reduced the footprint of the mounted die, thereby facilitating further module size reduction. FIG. 8 shows a schematic drawing of a die 802 having a transistor 804 attached to a substrate 806 with a solder 808, such as a power amplifier.

Figure 9A:
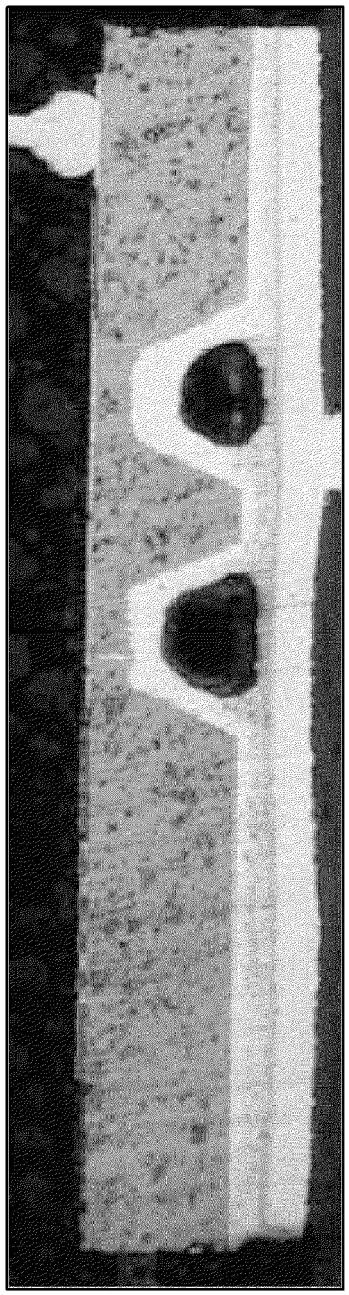
FIG. 9A is a cross-sectional view of a GaAs die with solder die attach according to one embodiment.
Figure 9B:
FIG. 9B is a cross-sectional view of a GaAs die with epoxy die attach.

FIG. 9A shows a cross-section picture of GaAs die with solder die attach. After reflow, solder coincide with the edge of the die, where the backside metallization ends. Whereas in the epoxy die attach, as shown in FIG. 9B, epoxy runs out during press and there is a typical runaway space along the edge of the GaAs die to accommodate the epoxy. Epoxy will also creep up on the sidewalls of the GaAs die. If this "creep-up" is not controlled sometimes epoxy paste can come up to the front surface of the die and short out bond pads where it attaches.

Figure 10:
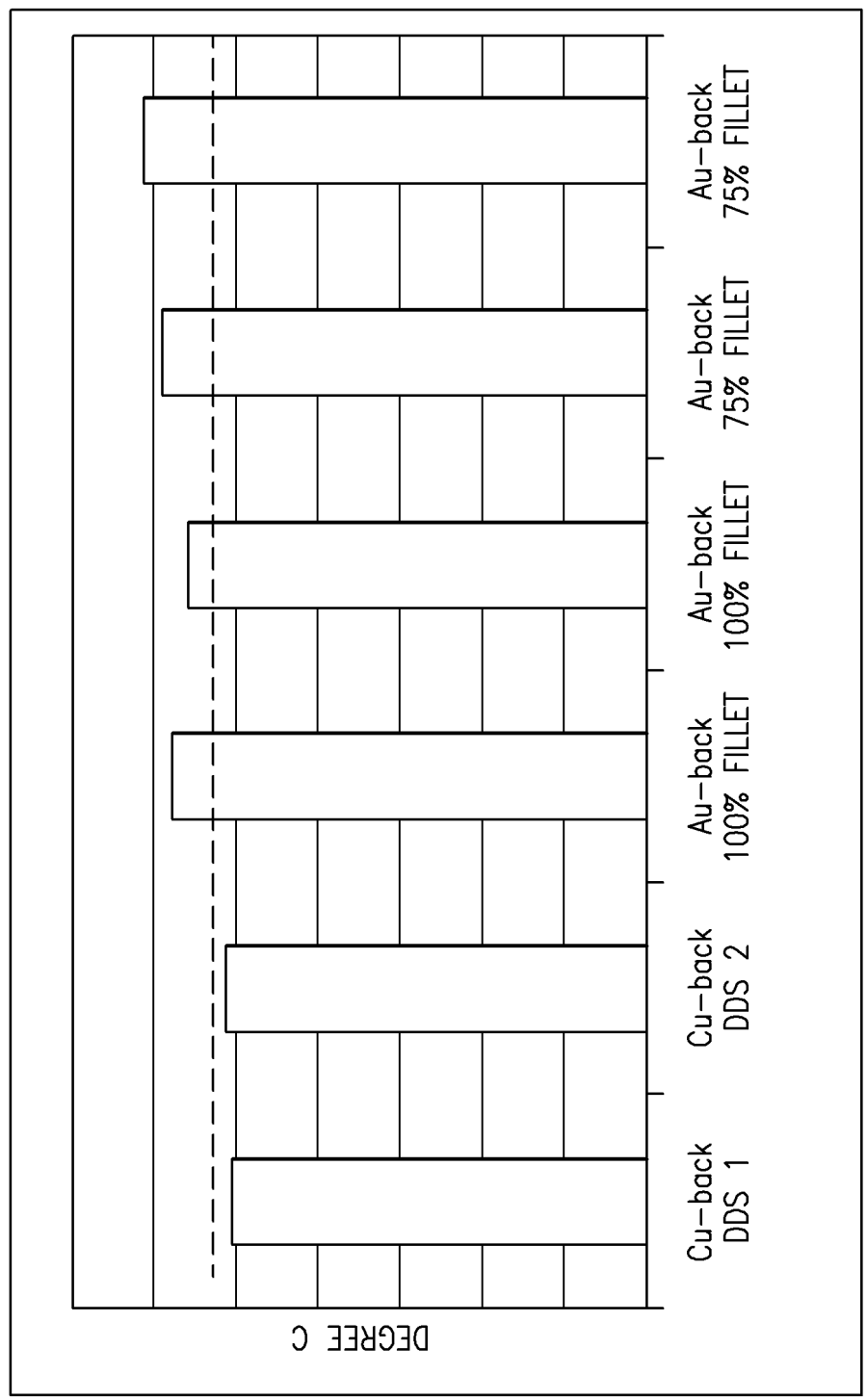
FIG. 10 shows a comparison of maximum operating temperatures between solder die attach according to one embodiment and epoxy die attach.
Figure 11:
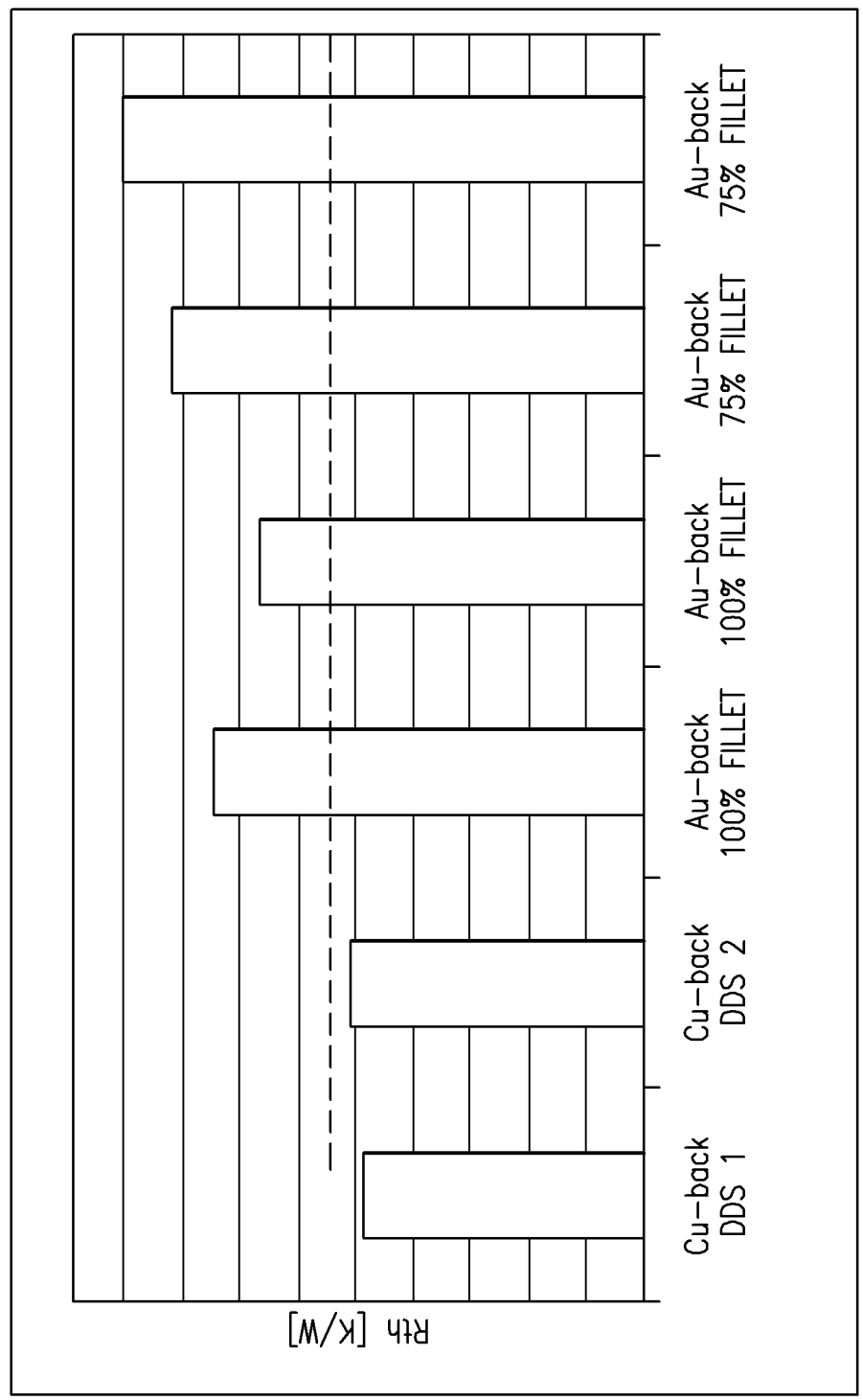
FIG. 11 shows a comparison of thermal resistance between solder die attach according to one embodiment and epoxy die attach.

An additional benefit of using DDS is that solder has higher electrical and thermal conductivity than epoxy. This can be advantageous for high power applications. In fact, thermal conductivity of solder can be 2-3 times higher than that of conductive epoxy. Accordingly, with DDS the heat generated from the transistors can be better dissipated onto the printed circuit board, resulting on lower operating temperature of the devices, as shown in FIG. 10. Lower temperature in turn will result in higher operating efficiency of the devices. FIG. 11 is a comparison of measured thermal resistance. The thermal resistance of solder die attach can be 25-40% lower than that of epoxy die attach. The thermal resistance of solder die attach can be at least 40% lower than that of epoxy die attach. Further, DDS can result in high mechanical integrity.

As the die heats up during operation, there is a need to transfer heat from the die to the PCB as efficiently as possible. The improved thermal conductivity afforded by solder can therefore improve operation of the die itself. Further, solder is typically less expensive than epoxy, allowing the manufacturer to achieve reduction in component costs.

However, DDS when applied to certain GaAs dies with NiV barrier and gold finish presents certain problems of its own. For example, solder typically reflows at approximately 260° C., depending on the exact composition of the solder. During the die attach process, the solder therefore should be heated at least to this temperature. At such high temperatures, however, contact metals may dissolve in the solder. For example, gold dissolves in solder at these temperatures. Copper likewise dissolves into solder and forms an intermetallic compound, especially under high temperature and high current density conditions. While copper typically dissolves into solder at a slower rate than gold, the formation of the intermetallic compounds has deleterious effects on die performance. The resultant copper intermetallic compounds have five to ten times higher resistivity and brittleness. Additionally, over time the copper can be partially or completely consumed by the solder, resulting in detachment of the copper contact layer from the die, resulting in device failure.

Figure 12:
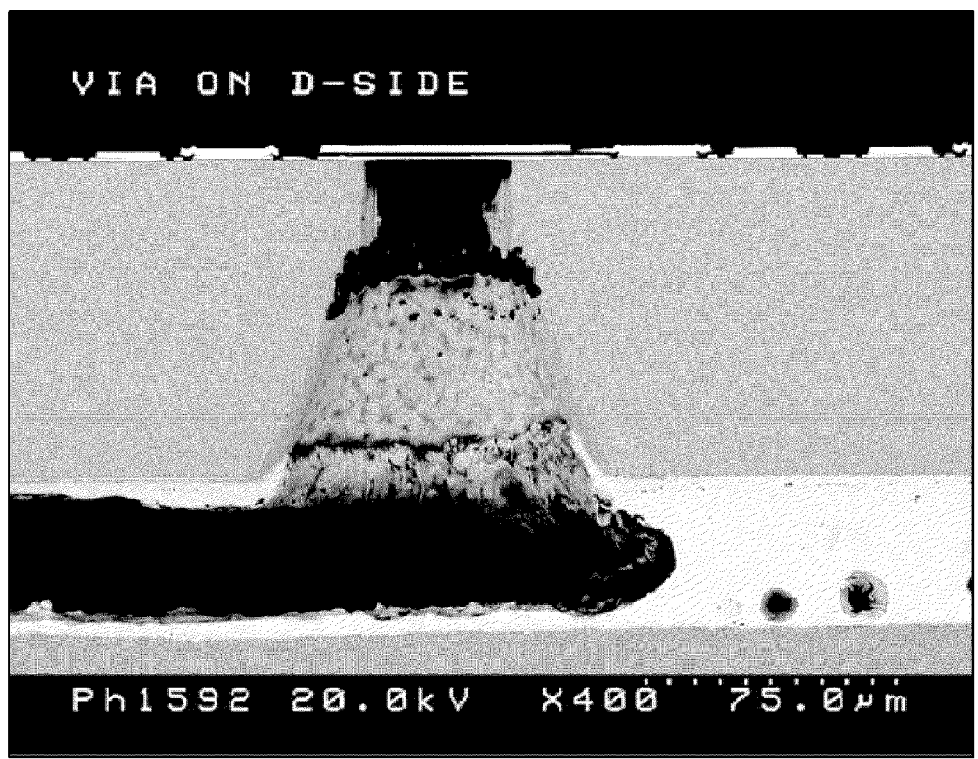
FIG. 12 shows failure of a traditional GaAs device with conventional NiV barrier layer and gold finish due to Cu—Sn intermetallic compound formation.

FIG. 12 shows a cross-section of a GaAs device which failed electrically. As shown, copper inside the via was consumed by solder under normal operating conditions, resulting in a disconnection of the front side device from the backside ground plane.

One method of failure of the GaAs device is through the formation of intermetallic compounds, leading to the consumption of copper as shown in FIG. 12. Traditional surface finishing, such as organic solder preservative ("OSP"), silver-contained polymer coating, or thin metal flash, can be inadequate to prevent the formation of intermetallic compounds during direct die solder die attach. Intermetallic compound formation is mainly temperature dependent. For example, the rate constant of Sn—Cu IMC's at 135° C. is 40 nm-sec$^{1/2}$. A typical 6 μm backside copper metallization can be consumed, thus leading to electrical failure, within hours. OSP or silver-contained polymers will usually not survive the hot solder reflow process.

As noted above, the DDS process poses certain problems, particularly in regards to the interaction of the solder and the backside metal contact material. Accordingly, steps can be taken to protect the backside metal contact material from being damaged by the solder.

Figure 13:
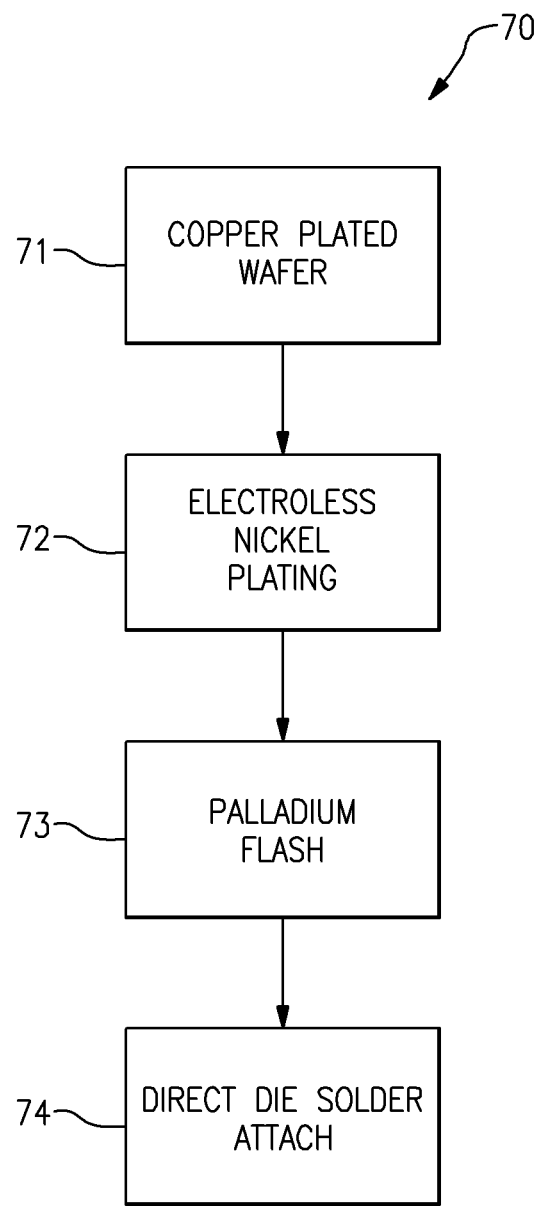
FIG. 13 is a block diagram representing the direct die solder process according to various aspects of the present invention.

One such process it illustrated in FIG. 13. FIG. 13 is a block diagram representing the direct die attach process according to various aspects of the present invention, with FIGS. 14A-14C showing examples of structures at various stages of the processing sequence of FIG. 14.

Figure 14A:
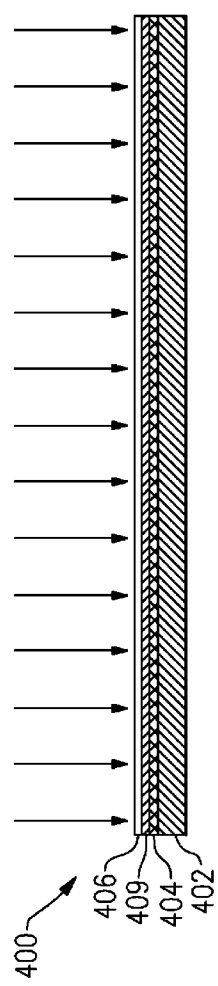
FIGS. 14A-14C show examples of structures at various stages of the processing sequence of FIG. 13.
Figure 14B:
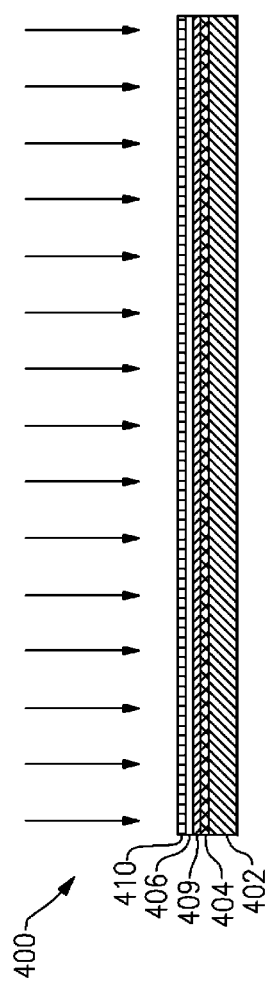
Figure 14C:
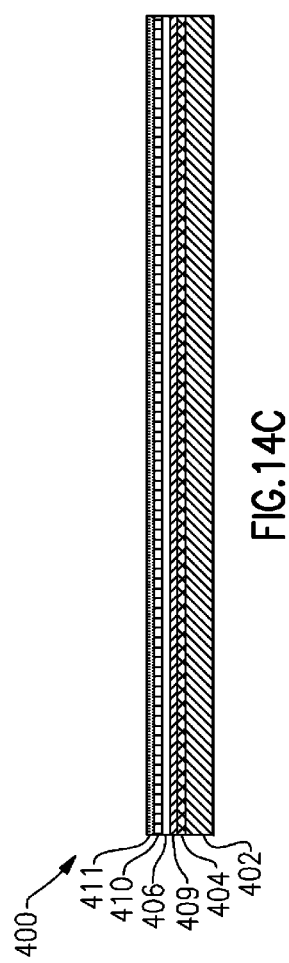

With reference to FIG. 14A, the process 70 begins with a copper plated wafer (block 71), a section 400 of which is illustrated. The wafer section 400 includes a GaAs substrate 402, seed layer 404, barrier layer 409, and copper contact layer 406. The wafer section 400 with a copper contact layer can be fabricated as described above with respect to FIGS. 6-7D. In some implementations, a pre-clean can be performed on the GaAs substrate 402 to clean oxides off.

As noted above, a direct copper contact layer may not amenable to use in DDS attachment processes. Referring to FIG. 14B, the copper layer can be protected from intermixing with solder at elevated temperatures by forming a layer of nickel.

Traditionally, GaAs wafers with backside copper metallization were sputtered with a thin NiV barrier layer, with a sputtered thin gold finish. This surface finishing is used typically in epoxy die attach to protect backside copper from oxidation. It offers an adequate oxidation protection without adding too much to the overall stress and wafer warpage. Initial electrical testing did not reveal any problems when the same surface finishing was used in solder die attach.

During reliability testing at higher temperature and normal operating current, however, DDS parts showed increased via resistance. These parts failed the reliability test prematurely. The failure mode that occurred was that the parts lost ground connection. Cross-section pictures, such as shown in FIG. 12 revealed that there was a reaction between backside copper and solder in contact with Cu. Intermetallic compounds were formed such that copper was consumed by solder. Further investigation showed that this reaction occurs not only on GaAs dies undergoing reliability test but also occurs on GaAs dies right after fabrication.

It is speculated the surface gold acts as a wetting layer such that during solder reflow the hot solder creeps up inside the GaAs via, especially the bottom of the via where the sputtered protection layer is at its thinnest. Hot solder penetrates through the protection NiV layer and reacts with the copper to form intermetallic compounds, $Cu_6Sn_5$ and $Cu_3Sn$. These intermetallic compounds are usually very brittle such that a slight mechanical impact would cause a breakage in the compound. When a large piece of such a compound falls out from the via, the ground connection is lost and the GaAs device will fail electrically, as shown in FIG. 12. Even if the via metallization structure is still intact, if the entire copper is converted to intermetallic compounds, via resistance will increase, which in turn will affect the functionality of the devices. For example, $Cu_3Sn$ has a resistivity of 8.93 Ωcm and $Cu_6Sn_5$ has a resistivity of 17.1 Ωcm, about 5 to 10 times higher than that of pure copper, respectively. If the entire copper is converted to intermetallic compounds, via resistance will be about 6 to 10 times higher than that of without intermetallic compounds. The formation of intermetallic compounds inside via will also increase thermal resistance due to increased thermal resistance of these intermetallic compounds. For example, thermal conductivity of $Cu_3Sn$ is 0.82 W/cmK and thermal conductivity of $Cu_6Sn_5$ is 0.418 W/cmK, whereas pure copper has a thermal conductivity of 4 W/cmK (or approximately 4 W/cmK), 5 to 10 times higher than that of the IMC.

Table 1 lists rate constants of Cu—Sn intermetallic compound formation at various temperatures. It can be seen that even at room temperature Cu readily reacts with Sn to form intermetallic compounds. At normal operating temperature (>135° C.), the formation of intermetallic compounds is accelerated, in which, the entire copper stack will be consumed within a week, by estimation. Table 1 also lists the reaction rate between Sn and Ni. It can be seen that Ni also reacts with Sn to form intermetallic compounds, even though at a much slower rate. It is estimated that the NiV barrier layer can be consumed by Sn within hours, due to the reason that it was so thin, especially at the bottom of the via. Some references also suggested that with a little added Ni in the mix, the reaction between Cu and Sn would be accelerated. Once Ni is consumed, Sn will continue corrode Cu until the entire Cu stack is fully consumed, at which point the devices will lose ground connection and the parts will fail. Therefore, a much thicker Ni layer is needed to prevent Cu—Sn intermixing and intermetallic compound formation inside via.

TABLE 1

Rate constants of Sn—Cu and Sn—Ni intermetallic compound formation
Rate Constants, nm × √sec

| IMC | RT | 70° C. | 100° C. | 135° C. | 170° C. |
|---|---|---|---|---|---|
| Sn—Cu | 0.2 | 1.01 | 1.22 | 4.0 | 6.35 |
| Sn—Ni | — | 0.238 | — | — | 1.87 |

Evaporation cannot be used in such an application to deposit thick Ni layer due to its poor step coverage. A thin Ni flash may not be helpful to prevent intermetallic compound formation, and in some cases can actually enhance formation. Neither is sputter a suitable technique to deposit a thick Ni or NiV layer (in the range of a micron) due to intensive target heating and severe film stress. Therefore, solder can creep up inside a via to penetrate the thin metal barrier and consume copper during a die attach process, which can lead to device failure.

Electroless plating is a preferred technique to deposit Ni in this application due to the reason that electroless plating can produce good step coverage to deposit sufficient Ni barrier layer at the bottom of the via. Electroless plating is also a batch process which can save cycle time. Further information can be found in the article "Electroless Nickel/Electroless Palladium/Immersion Gold Process for Multi-Purpose Assembly Technology" by Kuldip Johal, Hugh Roberts, and Sven Lamprecht, the entirety of which is hereby incorporated by reference in their entirety.

Accordingly, in some embodiments, an electroless nickel plating process can be used (block 72). As a result, a nickel layer 410 can cover the copper contact layer 106 and provide an effective barrier between the copper and the solder. The electroless nickel plating process can be used instead of other process, such as thin Ni flash and sputtering.

Electroless nickel plating is an auto-catalytic chemical technique well known in the art. It may be used to deposit a layer of nickel 410 over the copper 406. In some implementations, the copper layer 406 can be catalyzed before electroless nickel plating, which can minimize adhesion of nickel to the copper. In some implementations, the copper wafer can be submerged into an immersion palladium to catalyze the copper surface. In some embodiments, dimethyl amine borane (DMAB) can be used instead of, or in conjunction with, palladium to catalyze the copper surface. In some embodiments, hypophosphite and DMAB can be used as catalyzing agent. In some embodiments, catalyzation of the copper surface using DMAB can occur from pH 7-12. Further details on DMAB catalyization is discussed in the article "Direct Electroless Nickel Plating on Copper Circuits USING DMAB as a Second Reducing Agent" by Hideto Watanabe and Hideo Honma, the entirety of which is hereby incorporated by reference in its entirety. Electroless nickel can then be plated onto the copper surface at an elevated temperature for a short period of time.

GaAs wafers can be thinned down to 50-150 µm during backside processing, thereby facilitating through wafer etching and heat dissipation during device operation. Thus, because of the thinness, mechanical strength of a GaAs wafer is much lower than that of a Si wafer. The high stress of electrolessly plating nickel may cause wafer warpage, which can lead to problems in subsequent processing, and can cause wafer cracking and breakage during subsequent debonding processes. In some embodiments, a low stress nickel bath can be used. The thickness of the nickel layer can be controlled by adjusting the parameters of the electroless plating process, as is known in the art. The thickness of the nickel layer 410 can be selected to avoid stress on the wafer, which can disadvantageously lead to wafer bow or die crack.

For example, if the nickel layer 410 is too thick, it may impart undesirable stress on the wafer. Subject to too much stress, the wafer 400 may bow or crack or warp, thereby making subsequent processing more difficult, if not impossible. Accordingly, the nickel layer 110 should be sufficiently thick to provide an effective barrier between the copper layer 406 and the solder during attachment, without being so thick as to result in wafer bowing or cracking. However, if the nickel layer 410 is too thin, it may not be able to stop intermetallic compound formation. Because of the more stringent thickness requirements, the metallization process used for under bond metallization in the flip chip industry, or the thick barrier layers in the printed circuit board manufacturing industry, may not be used. From a barrier layer purpose, Ni should be thick enough to prevent the intermixing between Sn and Cu and intermetallic compound formation at elevated temperature. As shown in Table 2, keeping the Ni under a certain thickness can minimize the wafer warpage problem and the GaAs dies will pass electrical tests such as via resistance.

One issue associated with electroless Ni is film stress. A typical electroless Ni bath could use sodium hypophosphite as a reducing agent. The incorporation of hydrogen and phosphorus generated in the plating process, combined with thermal mismatch between base Cu metal and plated Ni barrier layer, may result in tensile stress of the plated Ni film. As discussed above, GaAs wafer is typically thinned before backside metallization. Any stress imposed on the film may contribute to wafer warpage, which may not only contribute to difficulties in subsequent processing, but also induce wafer breakage and die crack. With the complexity of the electroless Ni plating process and mechanical properties of Ni metal, the room to optimize the Ni plating process thus to reduce film stress is limited without changing chemistry. Wafer warpage is highly dependable on film thickness. Reducing the Ni film thickness will also reduce the wafer warpage, as seen in Table 2. The addition of Ni in the film stack on the through wafer via does not affect via resistance significantly. The thicker the Ni is, however, the worse the wafer warpage is. When the Ni film thickness is above a few microns, the wafer becomes significantly warped such that it cannot be processed further and may be scrapped.

TABLE 2

Wafer warpage measurements on Ni plated wafers.

| Lot# | Wafer# | Circuit up | Circuit down | Ni Thickness | Resistance |
|---|---|---|---|---|---|
| A | 1 | 0.75 mm | 3.0 mm | Thin | <10 mΩ |
|   | 2 | 0.75 mm | 3.0 mm | Thin | <10 mΩ |
|   | 3 | 0.75 mm | 3.75 mm | Mid | <10 mΩ |
|   | 4 | 1.0 mm | 3.75 mm | Mid | <10 mΩ |
| B | 2 | 1.0 mm | 2.0 mm | Thin | <10 mΩ |
|   | 3 | 1.0 mm | 2.5 mm | Thin | <10 mΩ |
|   | 4 | 0.75 mm | 2.0 mm | Mid | <10 mΩ |
|   | 5 | 1.0 mm | 3.75 mm | Mid | <10 mΩ |

Figure 15:
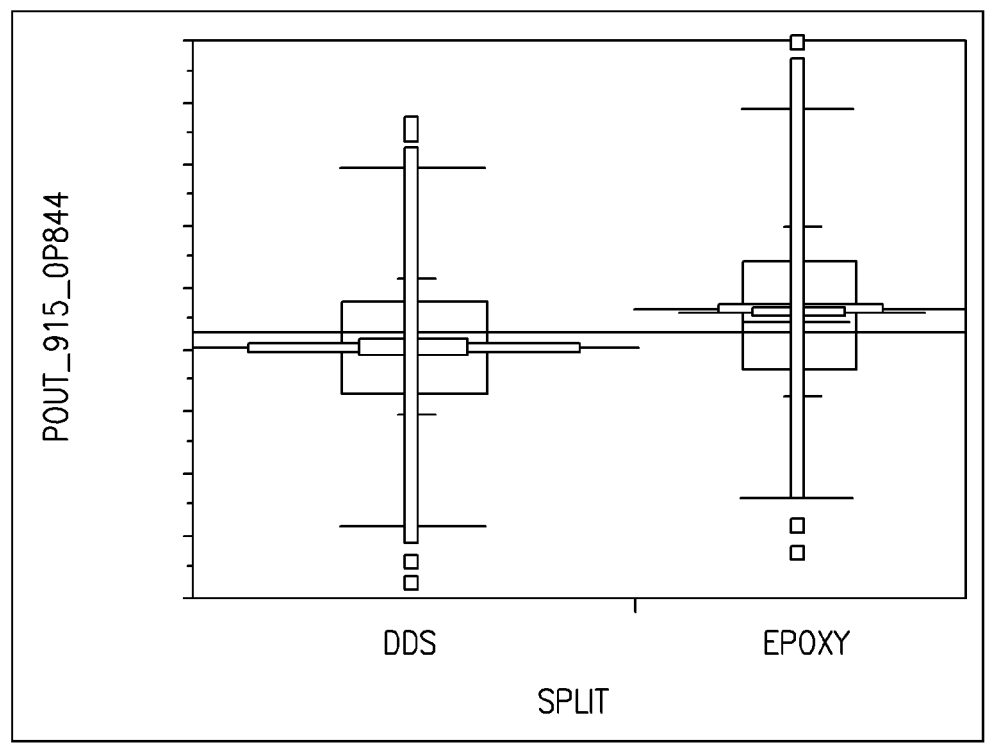
FIG. 15 shows an electrical comparison between solder die attach according to one embodiment and an epoxy die attach.

Another concern with added electroless Ni in the structure is the magnetism of the Ni metal. Electroless Ni can be non-magnetic if the phosphorus content is high enough. Unfortunately, higher phosphorus content in the film will also lead to higher stress of the film. Accordingly, in some embodiments the phosphorus content in the Ni plating is in the mid-range such that the Ni film is slightly magnetic. Due to the reason the GaAs power amplifiers are used in the RF application, this magnetic property would have adverse effect in the functioning of the devices. Expansive electrical testing on both wafer level and package level was carried out to ensure the added magnetism in the GaAs device is tolerable. FIG. 15 is an example of one of tests of the key parameters of the device, the power out. As shown in the figure, the power out at certain frequencies is probably impacted by the magnetism of the added Ni in the structure. It should be pointed out, however, that the overall difference between solder die attach and epoxy die attach is within a few tenth of a dB and it meets all the published electrical specifications of the device.

Figure 16:
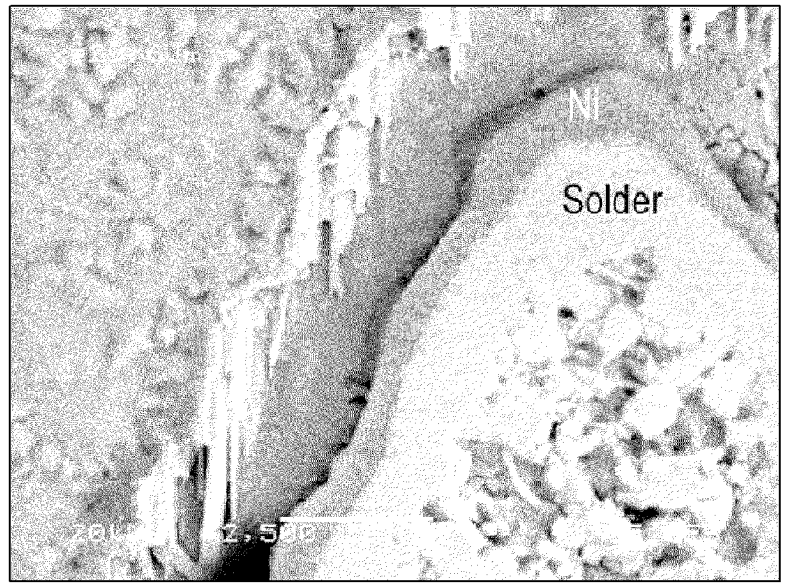
FIG. 16 shows a cross-section of a Ni-plated through wafer via.

FIG. 16 shows a cross-section picture of an electroless Ni plated GaAs device after over a thousand of hours of reliability testing with added electrical current and at elevated temperature. The Ni is shown intact without any sign of corrosion or intermixing by the solder. Cu is well protected and is still at its full thickness even after the designed life time of the device. The electroless Ni plating at the bottom of the through wafer via is well beyond the 40% coverage requirement, compared to the Ni thickness on the field. Another interesting aspect, shown in the figure, is that the solder wetted inside the entire via. This can be the benefit of the electroless Pd coating, plated after the Ni plating, to prevent Ni from oxidation, and discussed below. Pd can act as a wetting layer for the solder such that the solder coverage inside via is also improved.

Figure 17:
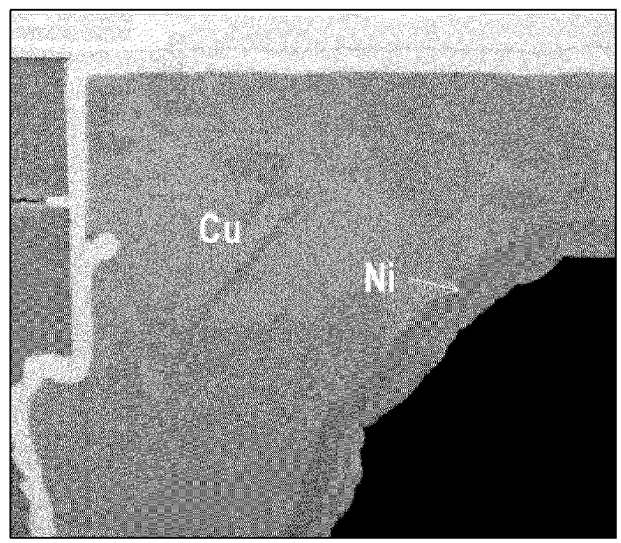
FIG. 17 shows a cross-section of a Ni-plated through wafer via.

FIG. 17 shows a cross-section of bottom of a through wafer via, which was plated with electroless Ni and electroless Pd. The continuous coverage of Ni inside via is clearly seen. Due to the high aspect ratio of the through wafer via, the bottom of the through wafer via is traditionally a problematic area for barrier layer coverage. If using sputtering process, for example, the typical coverage is less than 20% compared to the thickness on the field. Electroless Ni, on the other hand, can provide more than 40% coverage inside a via.

Exposed to atmosphere, nickel will readily oxidize. As shown in FIG. 18C, a palladium flash 411 (block 73) can be applied over the nickel layer 410 and the copper layer 406. The palladium flash 411 protects the nickel layer 410 from oxidation.

In some embodiments, an electroless palladium finish can be applied over the nickel layer 410 which can protect the nickel layer 410 from oxidation. Palladium can be used over, for example, gold because of its lower cost and excellent solder wettability.

Once the copper layer 406 has been covered with nickel layer 410, which in turn is coated with palladium flash 411, the wafer can proceed as described above with respect to FIGS. 4-5R.

Figure 18A:
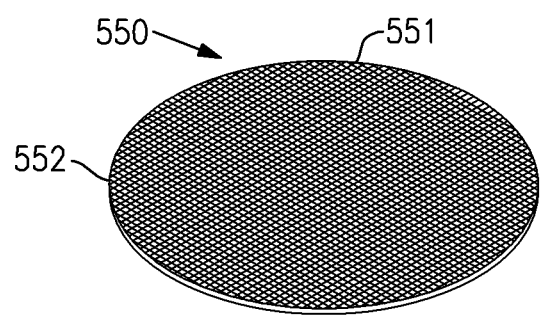
FIGS. 18A-18D show an example sequence of singulating a GaAs integrated circuit die from a wafer.

FIG. 18A illustrates a GaAs wafer 500 with a plurality of individual integrated circuits 551 formed in accordance with embodiments of the invention shown and described above with reference to FIGS. 6, 7A-7D, 13, and 14A-14C in which copper is used as a contact metal for the vias and back-side plane. As shown in FIG. 18A, streets 552 have been formed in the regions between each integrated circuit 551 on the wafer 550. As described above, street formation involves removing copper in the regions between the integrated circuits.

Figure 18B:
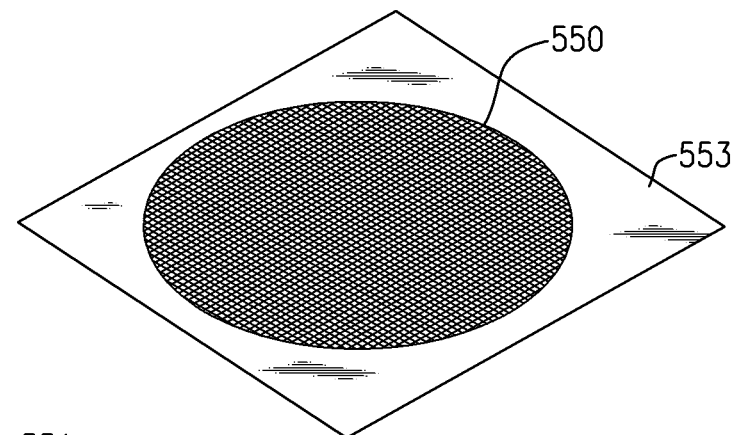
Figure 18D:
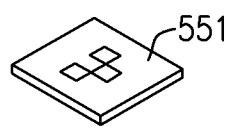
Figure 18C:
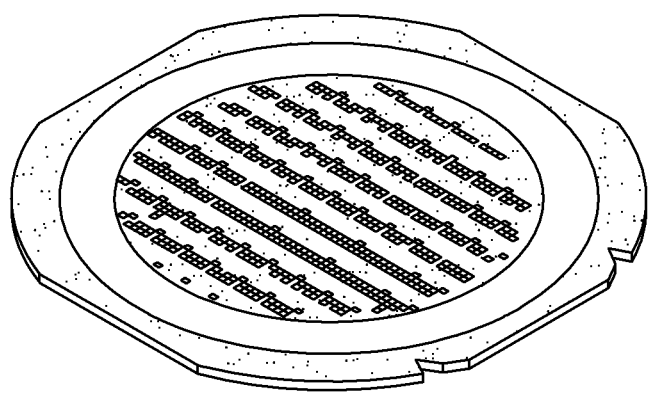

Following street formation, the wafer 550 is placed onto cutting tape 553, with the backside of the GaAs wafer 550 adhering to the cutting tape 553 and frame in the manner shown in FIGS. 18B and 18C. Next, the integrated circuit dies are singulated by cutting through the GaAs wafer along the pre-formed streets. A scribe may be applied to the streets in order to mechanically singulate the integrated circuit dies. Alternatively, a laser may be used to burn through the streets. Mechanical scribing is inexpensive, but typically less accurate than laser singulation, and may cause damage to the die. Laser singulation is more accurate and reduces damage, but at increased expense.

Once the integrated circuit dies have been singulated, the cutting tape is stretched apart. This stretching ensures that the dies have been singulated, as it results in widening the separation between each of the dies. The cutting tape may be stretched until the tape is visible between each of the dies. FIG. 18C illustrates stretched cutting tape in which some of the singulated dies have been removed. The dies may be removed from the cutting tape manually or by automated robotics. For example, an automated die-picking machine may select and remove individual dies through the use of vacuum pressure. FIG. 18D illustrates a singulated GaAs integrated circuit die, according to an embodiment of the present invention.

Once individual GaAs integrated circuit dies have been formed, they may be packaged for incorporation into larger electronic devices. Various types of packaging exist, some of which are described in more detail below. It will be understood that there exist myriad different types of packaging beyond those listed and described herein. Depending on the desired application, virtually any type of packaging may be used in accordance with the present invention. Four different packages are described in more detail below: ball grid array (BGA), land grid array (LGA), molded leadframe, and quad-flat no-leads (QFN).

Figure 19:
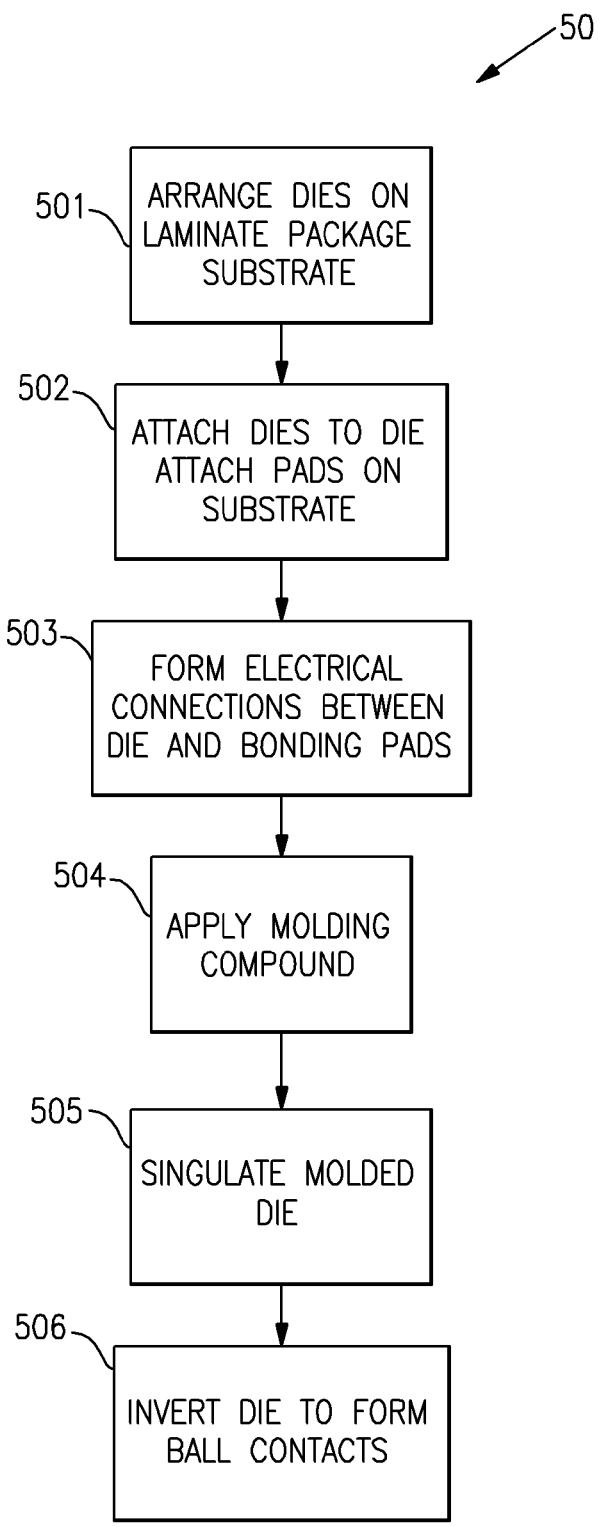
FIG. 19 shows an example sequence of ball grid array packaging of singulated GaAs integrated circuit dies, according to one embodiment.
Figure 20A:
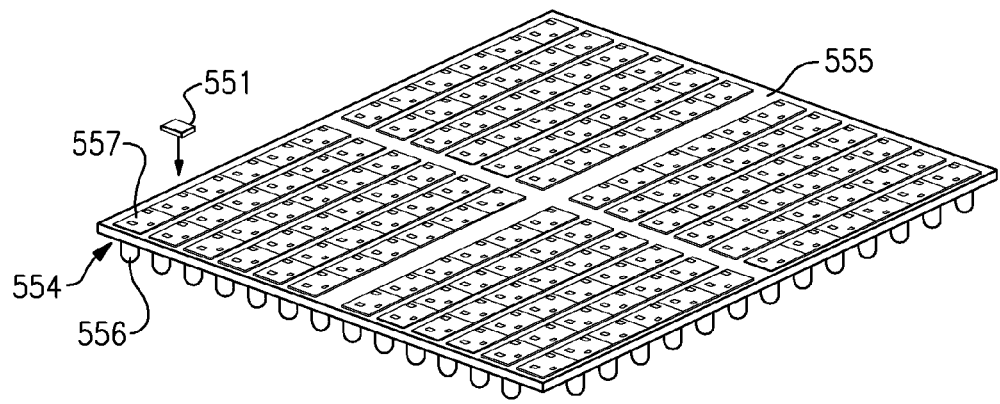
FIGS. 20A-20H show examples of structures at various stages of the processing sequence of FIG. 19.

FIG. 19 shows an example sequence of BGA packaging of singulated GaAs integrated circuit dies, according to one embodiment, with FIGS. 20A-20H showing examples of structures at various stages of the processing sequence of FIG. 19. With reference to FIG. 20A, individual dies 551 are arranged (block 501), typically in an array, onto a laminate packaging substrate 555. A single packaging substrate 555 such as that shown in FIG. 20A can include between 200 to 400 dies 551, although the specific number may vary depending on the application. The packaging substrate 555 includes pre-formed lower contact pads 554 on its lower surface. As described in more detail below, a grid of solder balls 556 are formed on the lower contact pads 554. On the top surface the packaging substrate has die attach pads 557, onto which singulated dies 551 are mounted, and a plurality upper contact pads 558. The singulated dies 551 are preferably soldered to the die attach pads 556. As illustrated, the die attach pads 557 have a footprint substantially identical to that of the singulated dies 551. The packaging substrate includes internal interconnections to electrically connect the upper contact pads 558 on the top surface to the lower contact pads 554 on the bottom surface.

Figure 20B:
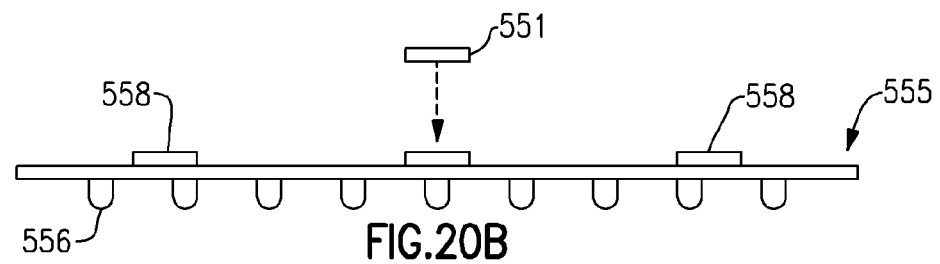
Figure 20C:
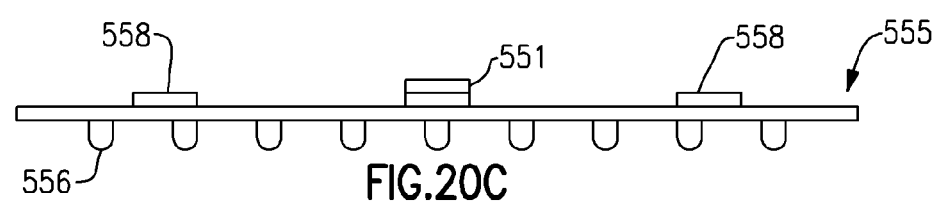

The die attach pad 557 is typically flat and made of tin-lead, silver, or gold-plated copper. With reference to FIGS. 20B and 20C, the individual dies 201 are attached to the die attach pads 207 (block 502) by applying solder paste to all die attach pads 557. Solder paste is an adhesive mixture of flux and tiny solder particles. The solder paste may be deposited by the use of a screen printing process, or by jet-printing. After the solder paste has been applied, individual dies are placed onto the packaging substrate 555 by robotic pick-and-place machines. Individual dies 551 may be removed from the cutting tape and transferred directly to the packaging substrate, where they are positioned to align the die attach pads with the contacts of the individual dies. The solder paste connects the die attach pads 557 to the contacts of the individual dies 551. To provide a more robust connection, the dies are subjected to heat treatment for solder reflow. The precise temperatures and times for this process will vary depending on the composition of the solder paste. Typical temperatures range from 100° to 260° C., with dwell times at peak temperatures ranging from 50 seconds to two minutes. This heat treatment causes the solder particles within the solder paste to melt. The solder is then allowed to cool, resulting in a robust electrical and mechanical connection between the packaging substrate and the individual dies.

Figure 20D:
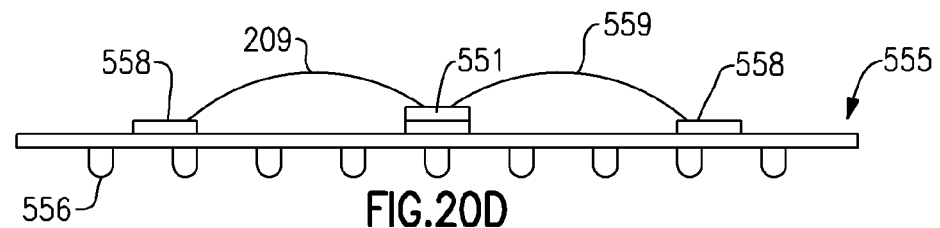

With reference to FIG. 20D, following attachment of the individual dies 551 to the packaging substrate 555, electrical interconnection is formed between bonding pads on the integrated circuit and the upper contact pads 558 on the top surface of the packaging substrate 555 (block 503). This connection may be formed by wire bonding or flip-chip methods. Wire bonding involves arranging wires 559, often made of copper, gold, or aluminum, between an upper contact pad 558 at one end, and a bonding pad on the integrated circuit die 551 at the other. The wire 559 is attached using some combination of heat, pressure, and ultrasonic energy to weld the wire 559 in place. Flip chip interconnection involves applying solder bumps to the bonding pads on the top surface of the integrated circuit. The integrated circuit is then inverted, and arranged such that the solder bumps align with contact pads. With the application of heat, the solder bumps melt and, following a cooling process, an electrical and mechanical connection may be formed between the bonding pads on the integrated circuit die and the contact pads on the packaging substrate.

Figure 20E:
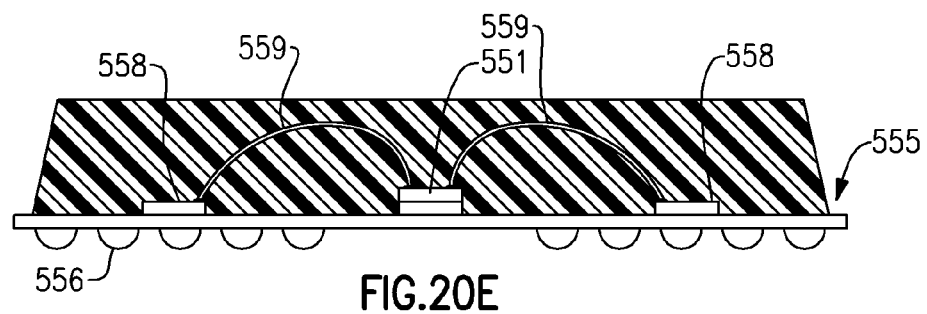
Figure 20F:
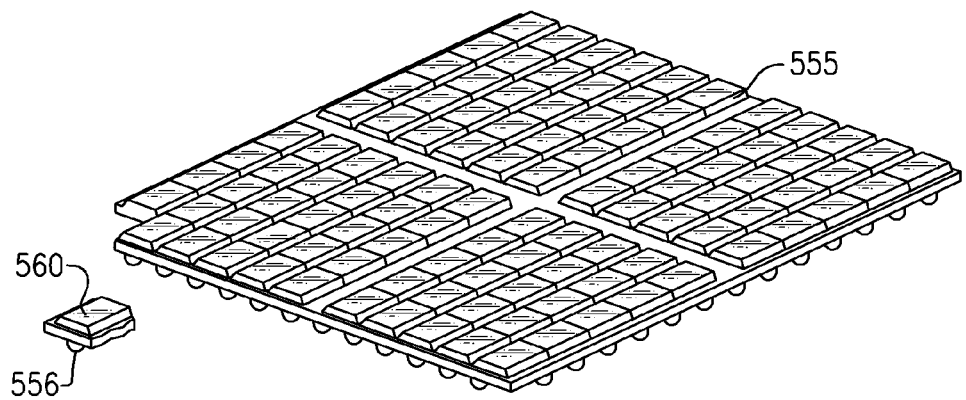

With reference to FIG. 20E, after electrical interconnection has been formed between the die and the packaging substrate, the entire packaging substrate is covered with a molding compound 560 (block 504). There are a wide variety of commercially available molding compounds. Typically, these are epoxy-based compounds. The packaging substrate 555 covered with the molding compound 560 is then cured in an oven. The temperature and duration of curing depends on the particular molding compound selected. As shown in FIG. 20F, after the molding compound 560 has cured, the each die 551 on the packaging substrate 560 is totally encapsulated, including the electrical interconnections 559, with only the bottom surface of the packaging substrate 555, with its lower contact pads, exposed. At this stage, the packaging substrate 555 covered with cured molding compound 560 can be sawed (block 505), thereby singulating the packaged devices. Singulation may be performed mechanically, such as with a wafer saw.

Figure 20G:
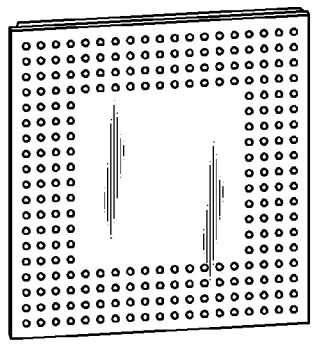
Figure 20H:
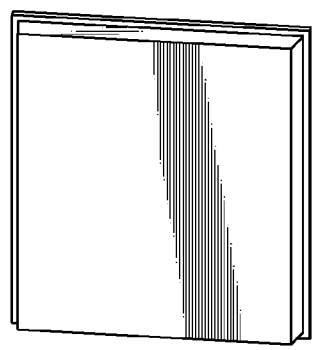

Each packaged device is inverted at this stage, and then on top of each lower contact pad 554 on the packaging substrate, a small ball of solder paste is deposited, creating a grid of solder paste balls 556 (block 506). The BGA package may then be placed over solder pads on a PCB, with each solder paste ball 556 aligned to a solder pad. The solder pads are flat, and typically made of tin-lead, silver, or gold-plated copper. FIG. 20E illustrates a schematic cross-section of a singulated BGA packaged die, with FIGS. 20G and 20H illustrating the top and bottom perspective views of the same.

Figure 21:
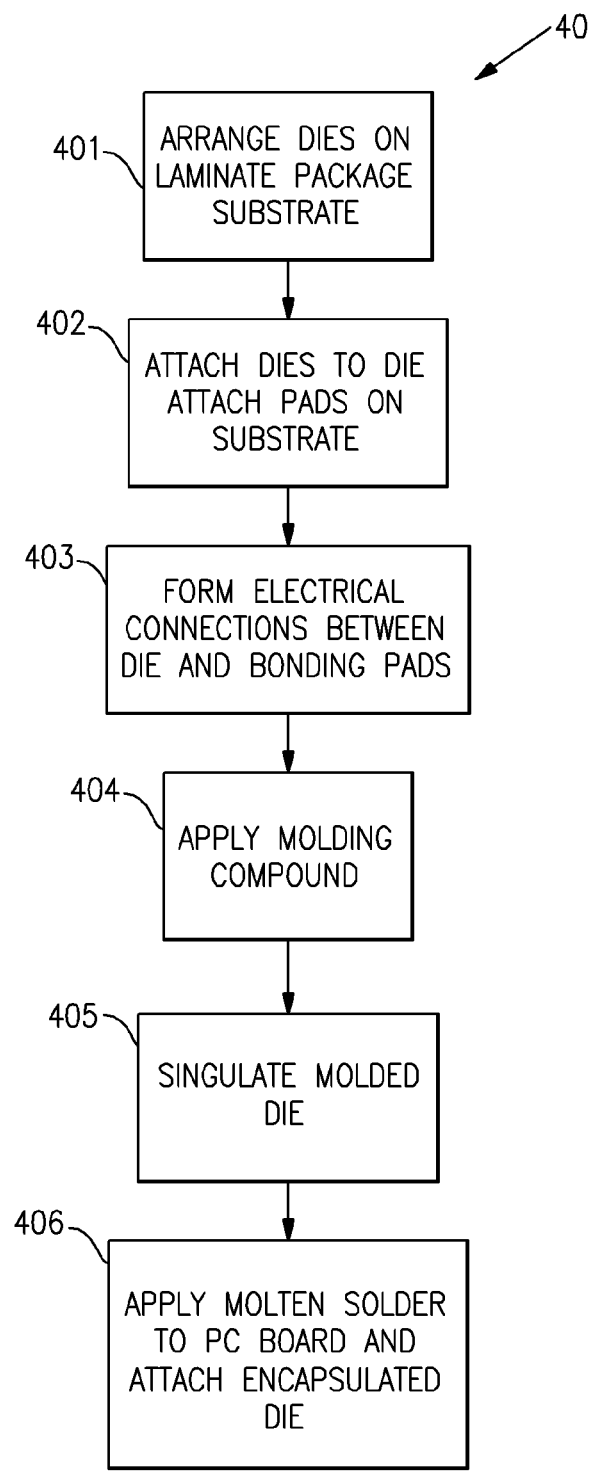
FIG. 21 shows an example shows an example sequence of land grid array packaging of singulated GaAs integrated circuit dies, according to one embodiment.
Figure 22A:
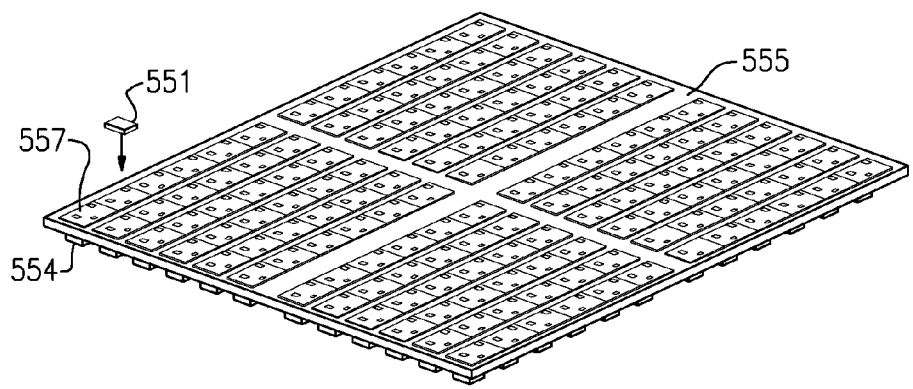
FIGS. 22A-22G show examples of structures at various stages of the processing sequence of FIG. 21.

FIG. 21 shows an example shows an example sequence of LGA packaging of singulated GaAs integrated circuit dies, with FIGS. 22A-22G showing examples of structures at various stages of the processing sequence of FIG. 21. In many respects, LGA packaging is similar to BGA packaging. As shown in FIG. 22A, individual dies 551 are arranged (block 401), typically in an array, onto a laminate packaging substrate 555. The packaging substrate 555 includes preformed lower contact pads 554 on its lower surface. On the top surface the packaging substrate has die attach pads 557, onto which singulated dies 551 are mounted, and a plurality upper contact pads 558. As illustrated, by using the DDS process discussed above, the die attach pads 557 may have a footprint substantially identical to that of the singulated dies 551. The packaging substrate includes internal interconnections to electrically connect the upper contact pads 558 on the top surface to the lower contact pads 554 on the bottom surface.

Figure 22B:
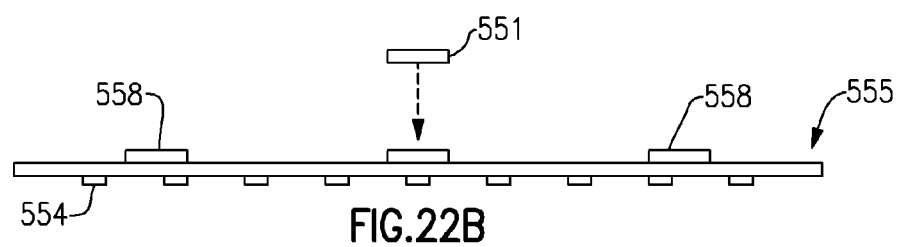
Figure 22C:
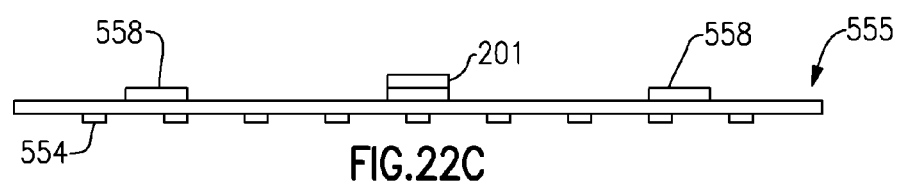

The die attach pad 557 is typically flat and made of tin-lead, silver, or gold-plated copper. With reference to FIGS. 22B and 22C, the individual dies 551 are attached to the die attach pads 557 (block 402) by applying solder paste to all die attach pads 557, similar to BGA packaging. After the solder paste has been applied, individual dies are placed onto the packaging substrate 555 by robotic pick-and-place machines. The solder paste connects the die attach pads 557 to the contacts of the individual dies 551. To provide a more robust connection, the dies are subjected to heat treatment for solder reflow, as described in more detail above.

Figure 22D:
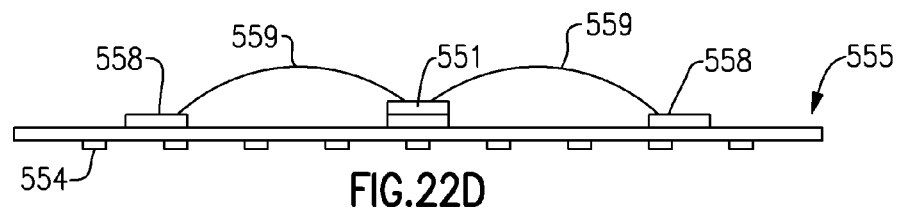

With reference to FIG. 22D, following attachment of the individual dies 551 to the packaging substrate 555, electrical interconnection is formed between bonding pads on the integrated circuit and the upper contact pads 558 on the top surface of the packaging substrate 555 (block 403). This connection may be formed by wire bonding or flip-chip methods, as described with respect to BGA packaging above.

Figure 22E:
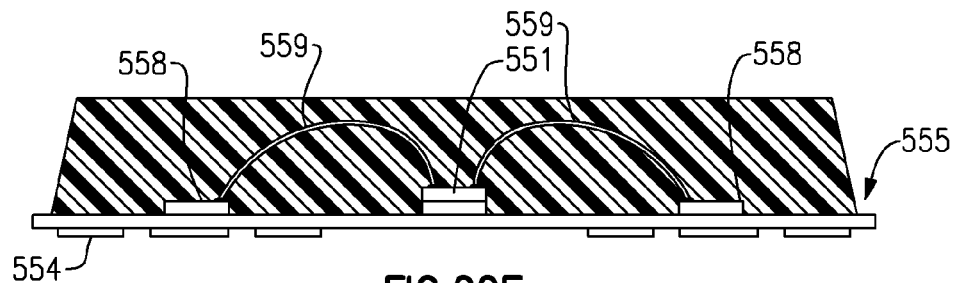
Figure 22F:
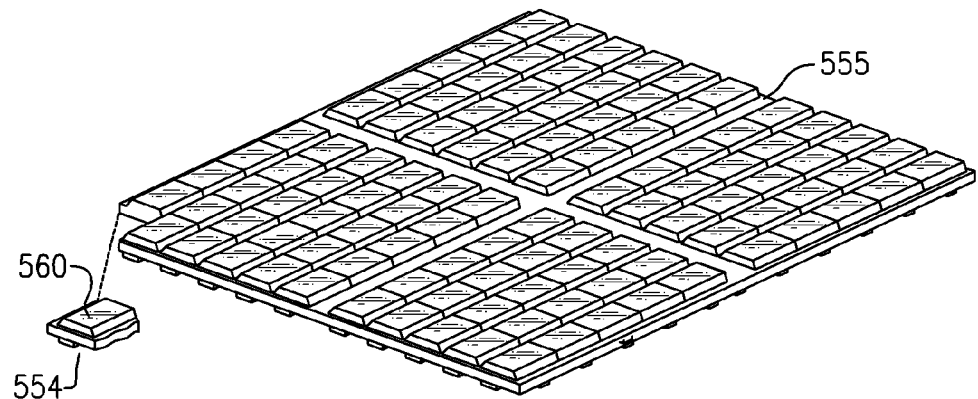

With reference to FIG. 22E, after electrical interconnection has been formed between the die and the packaging substrate, the entire packaging substrate is covered with a molding compound 560 (block 404). The packaging substrate 555 covered with the molding compound 560 is then cured in an oven. As shown in FIG. 22F, after the molding compound 560 has cured, the each die 551 on the packaging substrate 560 is totally encapsulated, including the electrical interconnections 559, with only the bottom surface of the packaging substrate 555, with its lower contact pads, exposed. At this stage, the packaging substrate 555 covered with cured molding compound 560 can be sawed (block 405), thereby singulating the packaged devices.

Figure 22G:
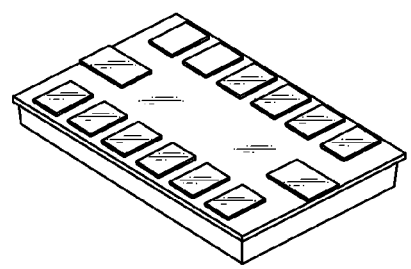

It is at this stage that LGA packaging deviates from BGA packaging described above. In contrast to BGA, LGA does not involve placing small balls of solder paste onto the packaging substrate. Rather, the solder paste, or alternatively molten solder, is placed onto the PCB over the solder pads, and then the LGA packaged device is arranged such that the contact pads 554 are aligned over the solder pads (block 406). For mounting onto a PCB, the package may be placed over corresponding solder pads on the PCB, followed by heat treatment to induce solder reflow. The PCB is outfitted with pre-formed conductive solder pads, also known as PCB pads, arranged to correspond to contact pads 554 of the packaging substrate. In short, BGA involves applying solder paste to the packaging substrate 555, whereas LGA involves applying solder paste to the PCB. FIG. 22E illustrates a schematic cross-section of a singulated BGA packaged die, with FIG. 22G illustrating a bottom perspective view of the same After placement of the packaged device on the packaging substrate, BGA and LGA proceed similarly. The packaged device mounted onto a PCB is subjected to a heat treatment for solder reflow, followed by a cool down period.

Figure 23:
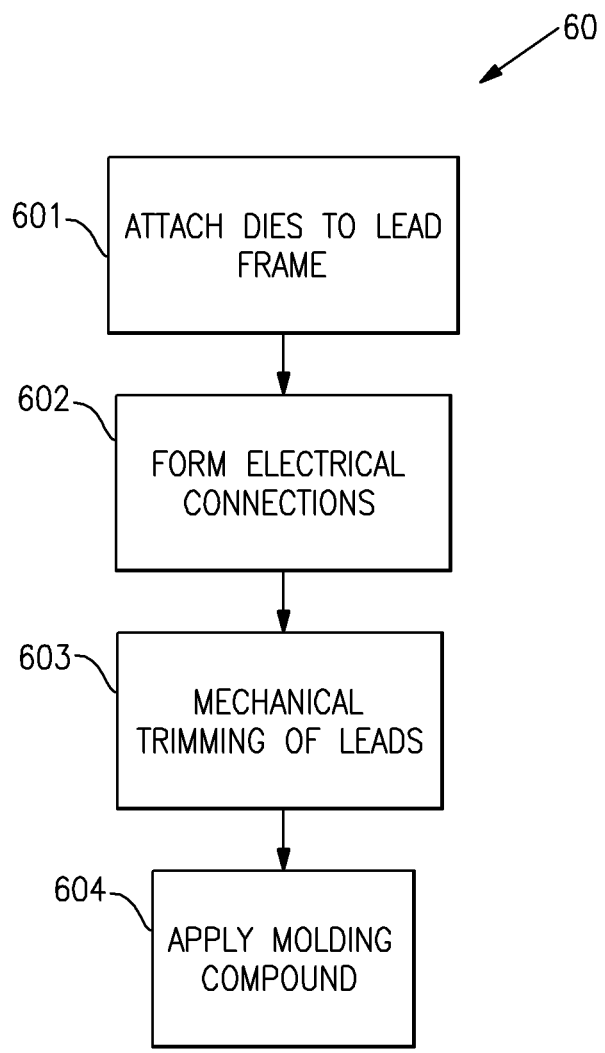
FIG. 23 shows an example shows an example sequence of leadframe packaging of singulated GaAs integrated circuit dies, according to one embodiment.
Figure 24A:
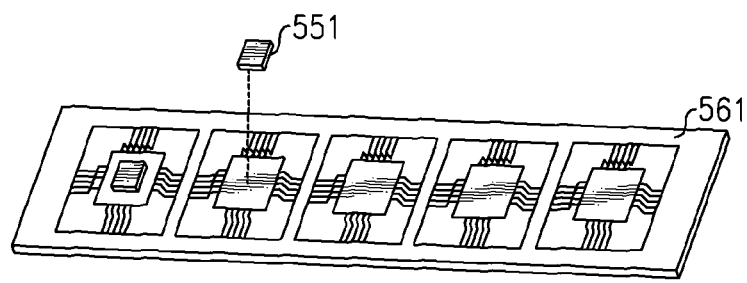
FIGS. 24A-24D show examples of structures at various stages of the processing sequence of FIG. 23, according to one embodiment.

FIG. 23 shows an example shows an example sequence of leadframe packaging of singulated GaAs integrated circuit dies, with FIGS. 24A-24D showing examples of structures at various stages of the processing sequence of FIG. 23. With reference to FIG. 24A, individual singulated integrated circuit dies 551 are mounted onto a metallic leadframe 561 (block 601). The leadframe 561 includes a plurality of die attach regions 562, and a plurality of leads 562. The leadframe 561 is typically made of a thin sheet of copper or copper alloy. In some instances, the copper is plated with another metal, such as pure tin, silver, nickel, gold, or palladium. For high-throughput, the processing may be performed in batches, in which an array or strip of connected leadframes is provided.

The singulated dies 551 can be mounted onto the die attach regions 552 of the leadframe 561 by an adhesive or soldering process (block 601). The bond is typically formed between the backside metallization of the die and the metal surface of the leadframe. The bond can be formed using solder paste followed by a reflow process, as described above. Alternatively, molten solder can be placed directly onto the die attach pad, followed by placement of the die. Conductive epoxy adhesives may also be used in place of solder.

Figure 24B:
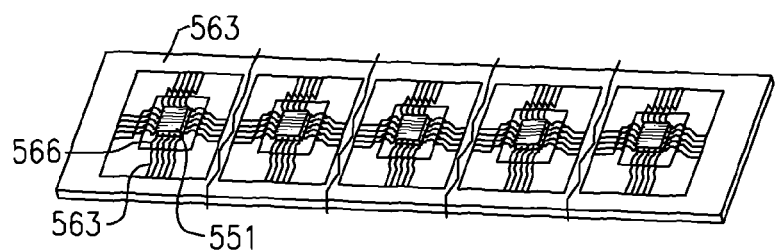
Figure 24C:
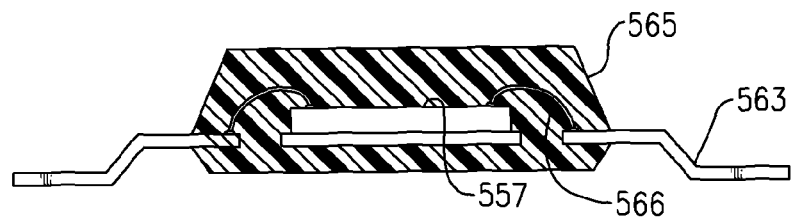
Figure 24D:
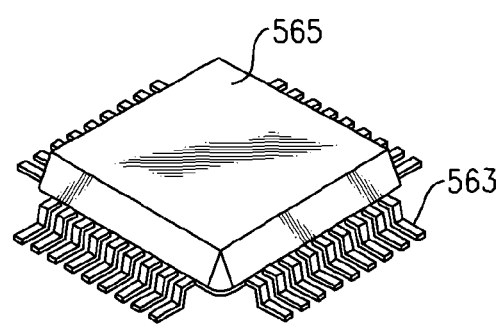

With reference to FIG. 24B, After the die has been attached to the leadframe, wire bonding is then used to form electrical connections 566 between the die attach pads to the package leads (block 602). Next, a mechanical trimming operation separates the leads 563 from the die bonding platform on the lead frame 561 (block 603). Plastic or other molding compound 565 is then injection molded around the die 551 and leadframe 551 to form the typical black plastic body (block 604), similar to the molding processes described above with respect to LGA and BGA packaging. In typical leadframe packaging, however, the frame for injection molding is designed such that a portion of the leads 563 remains uncovered by the molding compound 565. Following curing, the packaged device is presented with a portion of the leads 563 extending out from the cured molding compound, typically a black plastic. FIG. 24C illustrates a schematic cross-section of a singulated leadframe packaged die, with FIG. 24D illustrating a top perspective view of the same The sequence illustrated in FIG. 23 can also be applied to quad-flat no lead (QFN) packaging of singulated GaAs integrated circuit dies. FIGS. 25A-25E show examples of structures at various stages of the processing sequence. QFN packaging is similar to leadframe packaging, with some important distinctions. With reference to FIG. 25A, QFN packaging also begins with a leadframe 561 comprising die attach regions 562 and a plurality of leads 563. Singulated dies 551 are attached to the leadframe 301 in a manner similar to that described above with respect to standard leadframe packaging (block 701). As shown in FIG. 25B, Wire bonding then follows, as described above, to connect the die 551 to the leadframe leads 563 with wires 566 (block 702). With QFN packaging, however, the leads 563 are not designed to extend out beyond the cured molding materials after singulation. Accordingly, there is no need for singulation prior to injection molding of the molding compound over the leadframe and die. Instead, a batch of connected mounted dies 551 can be covered with a molding compound, followed by a curing process (block 703).

Once the molding compound 565 has cured, the leadframes with mounted dies are singulated (block 704). Typically a diamond saw is used to cut through the hardened cured molding compound 565. As the diamond saw cuts through the leads 563, each side of the QFN package has exposed portions of the leadframe 561. Unlike traditional leadframe packaging, however, the exposed portions are flush with the molding compound 565. The leads 563 are also typically exposed on the lower surface of the QFN package. FIG. 25C illustrates a schematic cross-section of a singulated QFN packaged die, with FIGS. 25D and 25E illustrating top bottom and perspective views of the same.

Mounted Integrated Circuit Device

Figure 26:
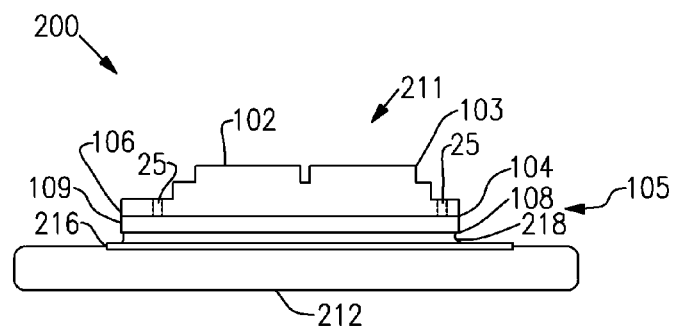
FIG. 26 illustrates a GaAs integrated circuit device made according to various methods of the present invention, mounted onto a printed circuit board.

FIG. 26 illustrates one embodiment of a GaAs integrated circuit device 200. The device 200 generally comprises a printed circuit board 212 connected to a GaAs integrated circuit 211. The GaAs integrated circuit 211 has a backside 105 and a frontside 103. The GaAs integrated circuit 211 includes a GaAs substrate 102, a barrier layer 104, a protective layer 108, and a copper contact layer 106. In some embodiments, the GaAs integrated circuit 211 may also include a seed layer 109 between the copper contact layer 106 and the barrier 104. The seed layer 109 may serve to facilitate mechanical and electrical connection to the copper contact layer 106, but is not always necessary. The printed circuit board includes a pad which is adapted to couple with the GaAs integrated circuit 211 at the backside 105. The GaAs integrated circuit 211 is configured to be mounted on the printed circuit board 212 by the pad 216. In one embodiment, the GaAs integrated circuit 211 is mounted to the pad 216 by a layer of solder 218 interposed between the backside 105 and the pad 216.

The barrier layer 104 is formed on the lower surface 105 of the GaAs substrate 102 and serves to isolate the copper contact layer 106 from the GaAs substrate 102 to prevent copper diffusion. The copper contact layer 106 is formed on the backside 105 of the GaAs integrated circuit 211. The copper contact layer 106 provides an electrical ground contact between the GaAs substrate 102 and the pad 216 on the printed circuit board 212. In one embodiment, the layer of solder 218 is formed between the copper contact layer 106 and the pad 216 to securely mechanically attach the backside 105 of the GaAs integrated circuit 211 to the printed circuit board 212. In one embodiment, the protective layer 108 is formed between the copper contact layer 106 and the solder 218 to prevent oxidation of the copper. The GaAs substrate 102 comprises a plurality of vias 25 which have been etched through the GaAs substrate 102 to form electrical connections between various integrated circuits disposed thereon. The vias 25 have sidewalls which will comprise the layers previously deposited on the GaAs substrate, as described in more detail above.

Figure 27:
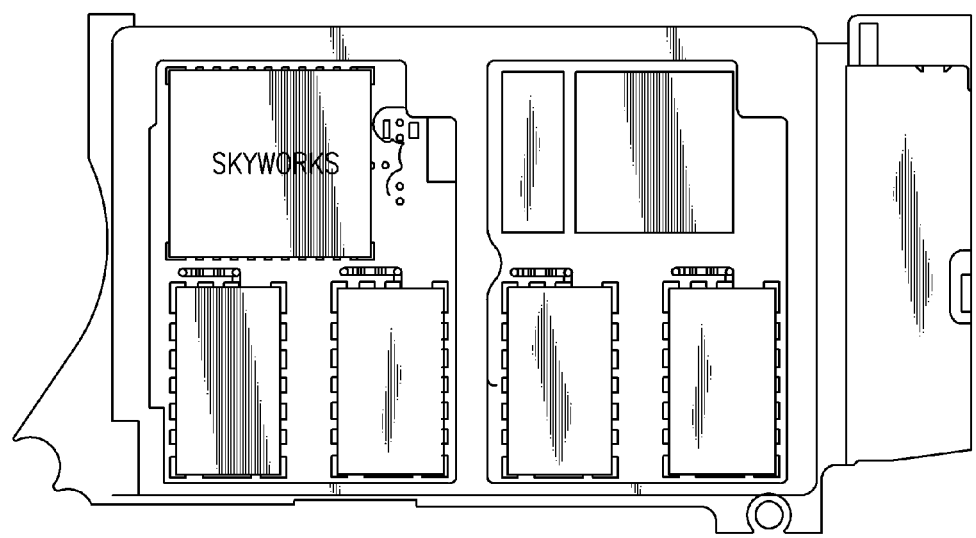
FIG. 27 illustrates an electronic device incorporating a GaAs integrated circuit device made according to various methods of the present invention.

FIG. 27 illustrates a portion of an electronic device incorporating a GaAs integrated circuit device made according to various methods of the present invention. In some embodiments, the device can be a portable wireless device, such as a cellular phone. The device can include a battery configured to supply power to the device, a circuit board configured to provide support for and to interconnect various electronic components, and an antenna configured to receive and transmit wireless signals. The electronic device can include a number of additional components, such as a display processor, central processor, user interface processor, memory, etc. In other embodiments, the electronic device may be a component of a tablet computer, PDA, or other wireless device.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A gallium-arsenide (GaAs) device comprising:
   a GaAs wafer having a catalyzed copper backside contact pad;
   a die attach pad, the die attach pad and the GaAs wafer having approximately the same footprint;
   a solder layer disposed between the catalyzed copper backside contact pad and the die attach pad, the solder layer configured to connect the GaAs wafer and the die attach pad; and
   a nickel-plated barrier layer disposed between the catalyzed copper backside contact pad and the solder layer.

2. The GaAs device of claim 1 wherein the GaAs wafer self-aligns with the die attach pad after reflow of the solder layer.

3. The GaAs device of claim 1 wherein the copper backside contact pad is catalyzed with palladium.

4. The GaAs device of claim 1 wherein the copper backside contact pad is catalyzed with dimethyl amine borane.

5. The GaAs device of claim 1 wherein the copper backside contact pad is catalyzed with both palladium and dimethyl amine borane.

6. The GaAs device of claim 1 wherein the GaAs wafer has a thickness of between 50-150 μm.

7. The GaAs device of claim 1 wherein the catalyzed copper backside contact pad has a thermal conductivity of approximately 4 W/cmK.

8. The GaAs device of claim 1 wherein a size of the die attach pad does not exceed a size of the GaAs wafer by more than 150 microns in at least one direction.

9. The GaAs device of claim 1 wherein the die attach pad is located on a substrate.

10. The GaAs device of claim 9 wherein the substrate is a printed circuit board.

11. A method for manufacturing a gallium-arsenide (GaAs) device, the method comprising:
    preparing a GaAs wafer having a copper backside contact pad;
    catalyzing the copper backside contact pad;
    applying a nickel barrier layer onto the catalyzed copper backside pad;
    preparing a die attach pad having approximately the same footprint as the GaAs wafer; and
    soldering the catalyzed copper backside contact pad to the die attach pad.

12. The method of claim 11 wherein the applying is electroless nickel plating.

13. The method of claim 11 wherein the nickel barrier layer is applied by sputtering or nickel flash.

14. The method of claim 11 wherein the catalyzing is performed prior to the plating.

15. The method of claim 11 wherein the die attach pad is connected to a substrate.

16. The method of claim 11 wherein a size of the die attach pad does not exceed a size of the GaAs wafer by more than 150 microns in at least one direction.

17. A packaged gallium-arsenide (GaAs) integrated circuit comprising:
    a printed circuit board;
    a die attach pad connected to the printed circuit board;
    a GaAs wafer having a catalyzed copper backside contact pad, the GaAs wafer having approximately the same footprint as the die attach pad;
    a solder layer disposed between the catalyzed copper backside contact pad and the die attach pad, the solder layer configured to connect the GaAs wafer and the die attach pad; and
    a nickel-plated barrier layer disposed between the catalyzed copper backside contact pad and the solder layer.

18. The packaged GaAs integrated circuit of claim 17 wherein a size of the die attach pad does not exceed a size of the GaAs wafer by more than 150 microns in at least one direction.

19. The packaged GaAs integrated circuit of claim 17 wherein the copper backside contact pad is catalyzed with both palladium and dimethyl amine borane.

20. The packaged GaAs integrated circuit of claim 17 wherein the catalyzed copper backside contact pad has a thermal conductivity of approximately 4 W/cmK.

* * * * *